(12) United States Patent
Hong et al.

(10) Patent No.: US 10,763,301 B2
(45) Date of Patent: Sep. 1, 2020

(54) DISPLAY DEVICE

(71) Applicant: LG ELECTRONICS INC., Seoul (KR)

(72) Inventors: Daewoon Hong, Seoul (KR); Sangtae Park, Seoul (KR); Myeongwook Bae, Seoul (KR); Jeongsik Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/159,025

(22) Filed: Oct. 12, 2018

(65) Prior Publication Data
US 2019/0237507 A1  Aug. 1, 2019

(30) Foreign Application Priority Data
Jan. 31, 2018 (KR) .......................... 10-2018-0012333

(51) Int. Cl.
| | |
|---|---|
| *H01L 33/36* | (2010.01) |
| *H01L 33/62* | (2010.01) |
| *H01L 27/15* | (2006.01) |
| *G09F 9/302* | (2006.01) |
| *G09G 3/32* | (2016.01) |

(52) U.S. Cl.
CPC .......... *H01L 27/156* (2013.01); *G09F 9/3026* (2013.01); *G09G 3/32* (2013.01); *H01L 33/36* (2013.01); *H01L 33/62* (2013.01); *G09G 2300/0426* (2013.01)

(58) Field of Classification Search
CPC ....... H01L 27/156; H01L 33/62; H01L 33/36; G09G 3/32; G09G 23/0426; G09G 3/3406; G09F 9/3026; G06F 1/1654; G06F 3/044; G06F 3/041; G06F 3/00
See application file for complete search history.

(56) References Cited

U.S. PATENT DOCUMENTS

| | | | |
|---|---|---|---|
| 2015/0109246 A1* | 4/2015 | Lee ......................... | G06F 3/045 345/174 |
| 2015/0199049 A1* | 7/2015 | Yang ....................... | G06F 3/044 345/174 |

FOREIGN PATENT DOCUMENTS

| | | |
|---|---|---|
| KR | 1020150009420 | 1/2015 |
| KR | 1020150026876 | 3/2015 |
| KR | 1020150084275 | 7/2015 |
| KR | 101689131 | 12/2016 |

OTHER PUBLICATIONS

PCT International Application No. PCT/KR2018/013012, International Search Report dated Feb. 20, 2019, 3 pages.

* cited by examiner

*Primary Examiner* — Galina G Yushina
(74) *Attorney, Agent, or Firm* — Lee, Hong, Degerman, Kang & Waimey

(57) ABSTRACT

A display device is disclosed. The display device includes a light-transmitting substrate having one surface, a pad formed on the one surface, and an electrode layer formed on the one surface, electrically connected to the pad, and having a mesh shape. The electrode layer includes a first region adjacent to the pad and spaced apart from the pad, and a second region connecting the pad to the first region. A density of the mesh shape of the second region is higher than a density of the mesh shape of the first region.

11 Claims, 42 Drawing Sheets

DISPLAY DEVICE

CROSS-REFERENCE TO RELATED APPLICATIONS

Pursuant to 35 U.S.C. § 119(a), this application claims the benefit of earlier filing date and right of priority to Korean Patent Application No. 10-2018-0012333, filed on Jan. 31, 2018, the contents of which are hereby incorporated by reference herein in its entirety.

BACKGROUND OF THE INVENTION

Field of the Invention

Embodiments of the invention relate to a display device.

Discussion of the Related Art

Digital signage is a communication tool that enables advertisers to use marketing, advertising, training, etc. and to induce customer experiences. The digital signage is a digital imaging device that provides both typical broadcasting content as well as advertising content intended by the advertisers in public places such as airports, hotels, hospitals, etc. Since the digital signage not only has a built-in processor and memory, but also can move freely and express various contents clearly, it can be used for a variety of purposes, such as promotional use, customer service, and information media in department stores, subways, bus stops, etc. In addition, not only advertising content is provided through the digital signage, but various contents can be provided.

The digital signage generally uses a plurality of LEDs. The LEDs have long life span and high luminous efficiency, so they are used instead of conventional fluorescent lamps and incandescent bulbs. In addition, since the LEDs are smaller than the conventional light sources, they are more popular as illumination devices.

SUMMARY OF THE INVENTION

One object of the present disclosure may be to provide a display device that prevents disconnection between an electrode layer and a pad.

Another object of the present disclosure may be to provide a display device that is not reddish even when copper is used as an electrode layer.

The other object of the present disclosure may be to provide a display device that prevents disconnection of an electrode layer connecting a plurality of pads.

In one aspect, there is provided a display device including a light-transmitting substrate having one surface, a pad formed on the one surface, and an electrode layer formed on the one surface, electrically connected to the pad, and having a mesh shape. The electrode layer includes a first region adjacent to the pad and spaced apart from the pad and a second region connecting the pad to the first region. A density of the mesh shape of the second region is higher than a density of the mesh shape of the first region.

A length of the second region may be less than a length of the pad.

The mesh shape may include a plurality of first lines extending in a longitudinal direction of the electrode layer, and spaced apart in a direction orthogonal to the longitudinal direction of the electrode layer and a plurality of second lines extending in the direction orthogonal to the longitudinal direction of the electrode layer, spaced apart along the longitudinal direction of the electrode layer, and intersecting the first line.

The pad may include a side connected to one side of the second region, and a width of the one side may be substantially equal to a length of the side.

The second region may include other side connected to the first region, and a width of the other side may be smaller than the width of the one side.

The pad may include a mesh shape electrically connected to the electrode layer.

The pad may include a metal film.

The electrode layer may include copper oxide.

The display device may further include a second pad formed on the one surface, spaced apart from the pad, and spaced apart from the electrode layer and a second electrode layer electrically connecting the pad to the second pad and having a mesh shape. A density of the mesh shape of the second electrode layer may be higher than the density of the mesh shape of the first region.

The density of the mesh shape of the second electrode layer may be substantially equal to the density of the mesh shape of the second region.

The electrode layer may include a third region electrically connected to the second pad, and a density of the mesh shape of the third region may be higher than the density of the mesh shape of the first region.

The density of the mesh shape of the third region may be substantially equal to the density of the mesh shape of the second region.

The display device may further include a third pad formed on the one surface, spaced apart from the pad, and spaced apart from the electrode layer and a third electrode layer electrically connecting the pad to the second pad. The third electrode layer may include a metal film.

According to at least one of embodiments of the invention, disconnection of a pad and an electrode layer can be prevented.

According to at least one of embodiments of the invention, disconnection of an electrode layer connecting a plurality of pads can be prevented.

According to at least one of embodiments of the invention, even when copper is used as an electrode layer, a display device that is not reddish can be provided.

Additional scope of applicability of the invention will become apparent from the following detailed description. However, since various changes and modifications within the spirit and scope of the invention can be understood by those skilled in the art, it should be understood that specific embodiments, such as the detailed description and the preferred embodiments of the invention, are given as examples.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
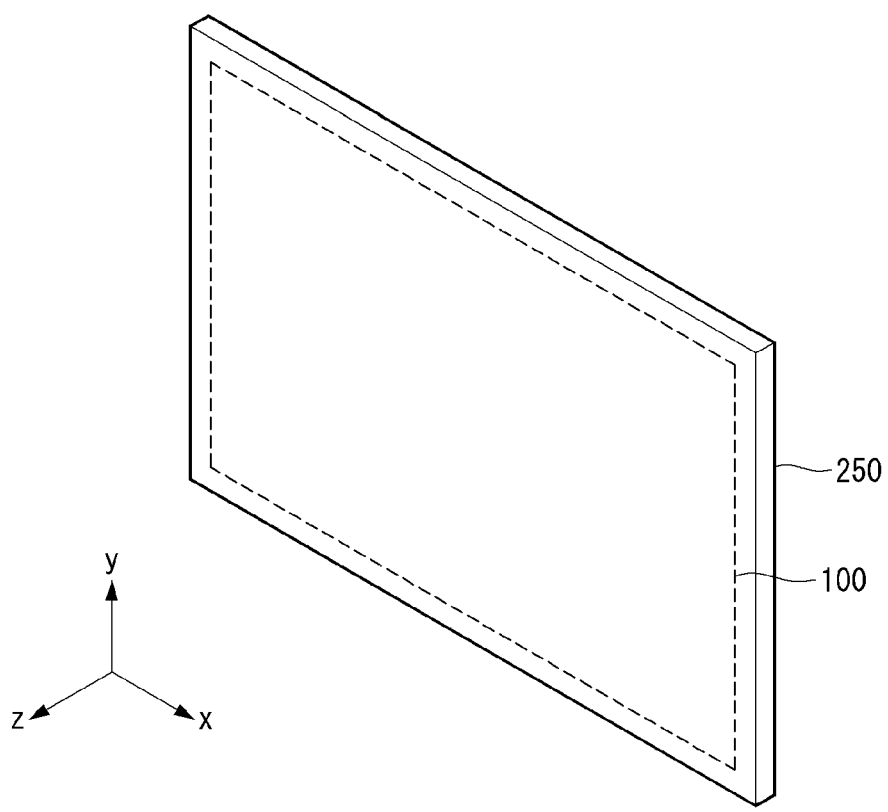
FIGS. 1 to 42 are views illustrating a display device according to various embodiments of the invention.

Reference will now be made in detail embodiments of the invention examples of which are illustrated in the accompanying drawings. Since the invention may be modified in various ways and may have various forms, specific embodiments are illustrated in the drawings and are described in detail in the present specification. However, it should be understood that the invention are not limited to specific disclosed embodiments, but include all modifications, equivalents and substitutes included within the spirit and technical scope of the invention.

The terms 'first', 'second', etc. may be used to describe various components, but the components are not limited by such terms. The terms are used only for the purpose of distinguishing one component from other components. For example, a first component may be designated as a second component without departing from the scope of the invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the invention are provided to those skilled in the art in order to describe the invention more completely. Accordingly, shapes and sizes of elements shown in the drawings may be exaggerated for clarity.

Hereinafter, the +x-axis direction may be referred to as a right direction. The -x-axis direction may be referred to as a left direction. The +y-axis direction may be referred to as an upward direction. The -y-axis direction may be referred to as a downward direction. The +z-axis direction may be referred to as a forward direction or a front direction. The -z-axis direction may be referred to as a backward direction or a rear direction.

Referring to FIG. 1, a display device 100 may be attached to an attached surface 250. The attached surface 250 may be a transparent material. For example, the attached surface 250 may be a glass. The display device 100 may be a transparent material. For example, the display device 100 may comprise a transparent resin layer. Although the display device 100 is attached to the attached surface 250, the display device 100 and the attached surface 250 can transmit light.

The display device 100 may display a screen. The display device 100 may emit light forward. Alternatively, the display device 100 may emit light in the +z-axis direction. The light emitted from the display device 100 may travel forward through the attached surface 250. Alternatively, the light emitted from the display device 100 may travel in the +z-axis direction through the attached surface 250.

Figure 2:
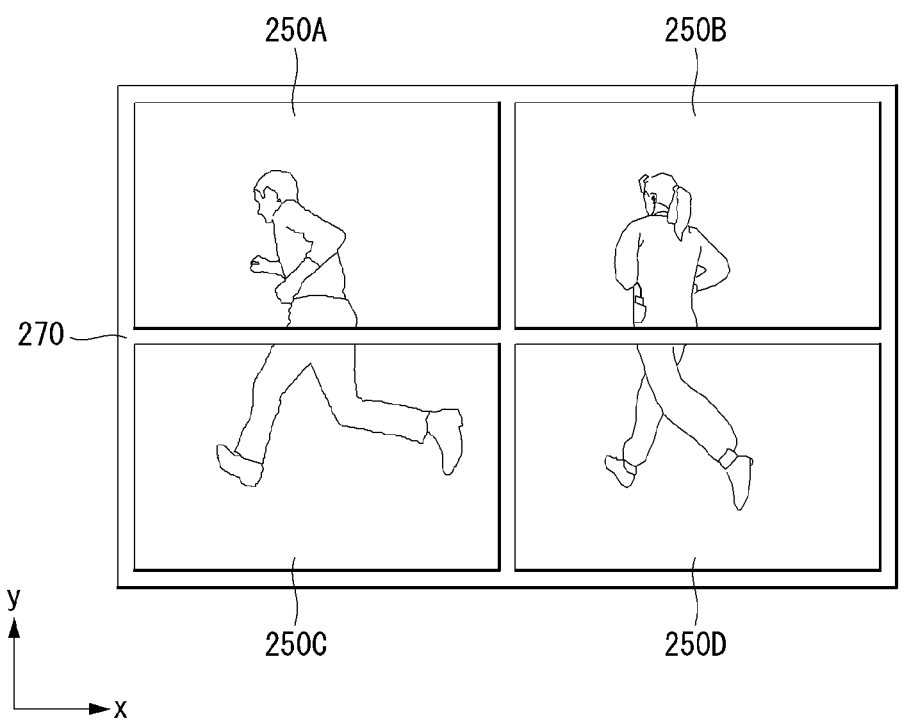

Referring to FIG. 2, the attached surfaces 250A, 250B, 250C and 250D may be fixed to a frame 270. A plurality of attached surfaces 250A, 250B, 250C, and 250D may be fixed to the frame 270, respectively. A plurality of display devices may be attached to the respective attached surfaces 250A, 250B, 250C, and 250D. The plurality of display devices can interlock with each other and display a screen. For example, the plurality of display devices can divide and display one screen. Each display device can display a part of one screen.

Figure 3:
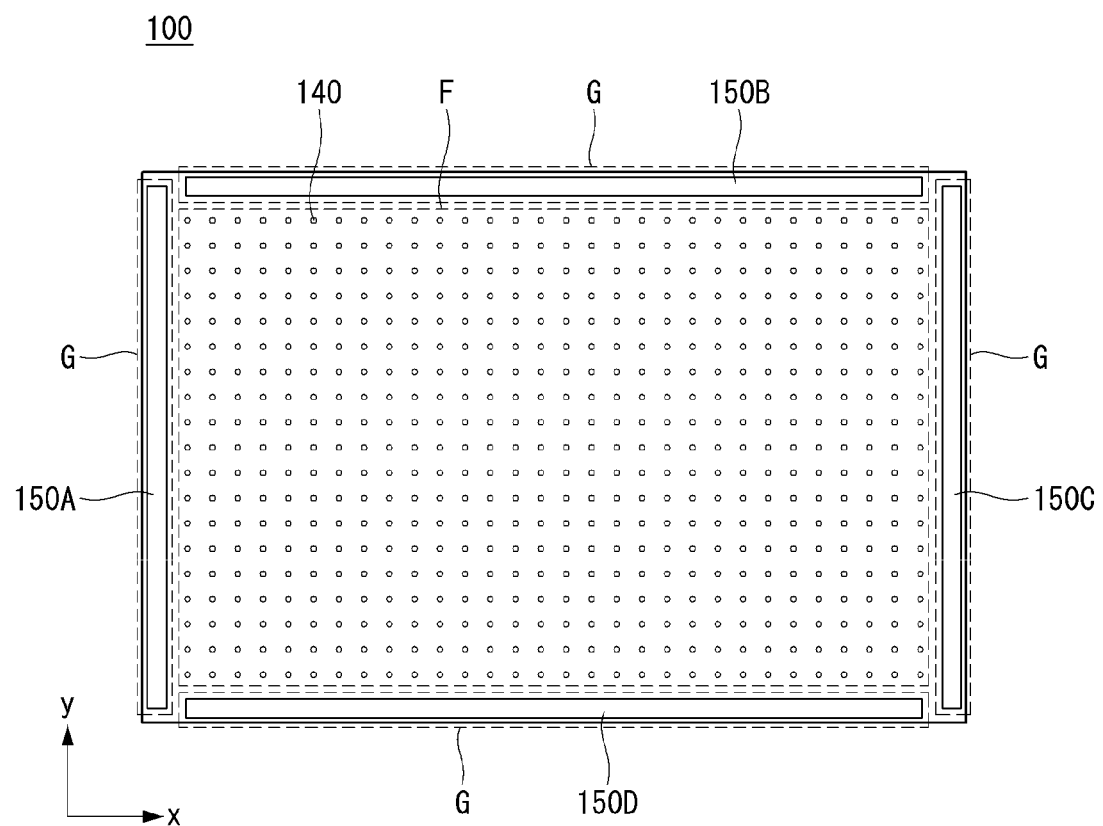

Referring to FIG. 3, the display device 100 may have a rectangular shape. A plurality of light source assemblies 140 may be installed in the display device 100. Connectors 150A, 150B, 150C, and 150D may be disposed along a periphery of the display device 100. That is, the connectors 150A, 150B, 150C, and 150D may be disposed along four sides of the display device 100. The connectors 150A, 150B, 150C, and 150D may surround the plurality of light source assemblies 140.

The plurality of light source assemblies 140 may be electrically connected to the display device 100. The connectors 150A, 150B, 150C and 150D may be electrically connected to the display device 100. The connectors 150A, 150B, 150C and 150D may be connected to the plurality of light source assemblies 140 through the display device 100. The connectors 150A, 150B, 150C, and 150D can transmit power supplied from a power supply unit to the light source assemblies 140. In addition, the light source assemblies 140 can receive control signals transmitted from a controller through the connectors 150A, 150B, 150C, and 150D.

In the display device 100, an area in which the plurality of light source assemblies 140 are installed may be referred to as a display area F. In the display device 100, an area in which the connectors 150A, 150B, 150C, and 150D are installed may be referred to as a bezel area G. The connectors 150A, 150B, 150C, and 150D may be disposed along four sides of the display device 100 to smoothly transmit the power and the control signals to the plurality of light source assemblies 140. By disposing the connectors 150A, 150B, 150C and 150D on the four sides of the display device 100, a ratio of the bezel area G can be increased and a ratio of the display area F can be reduced.

Figure 4:
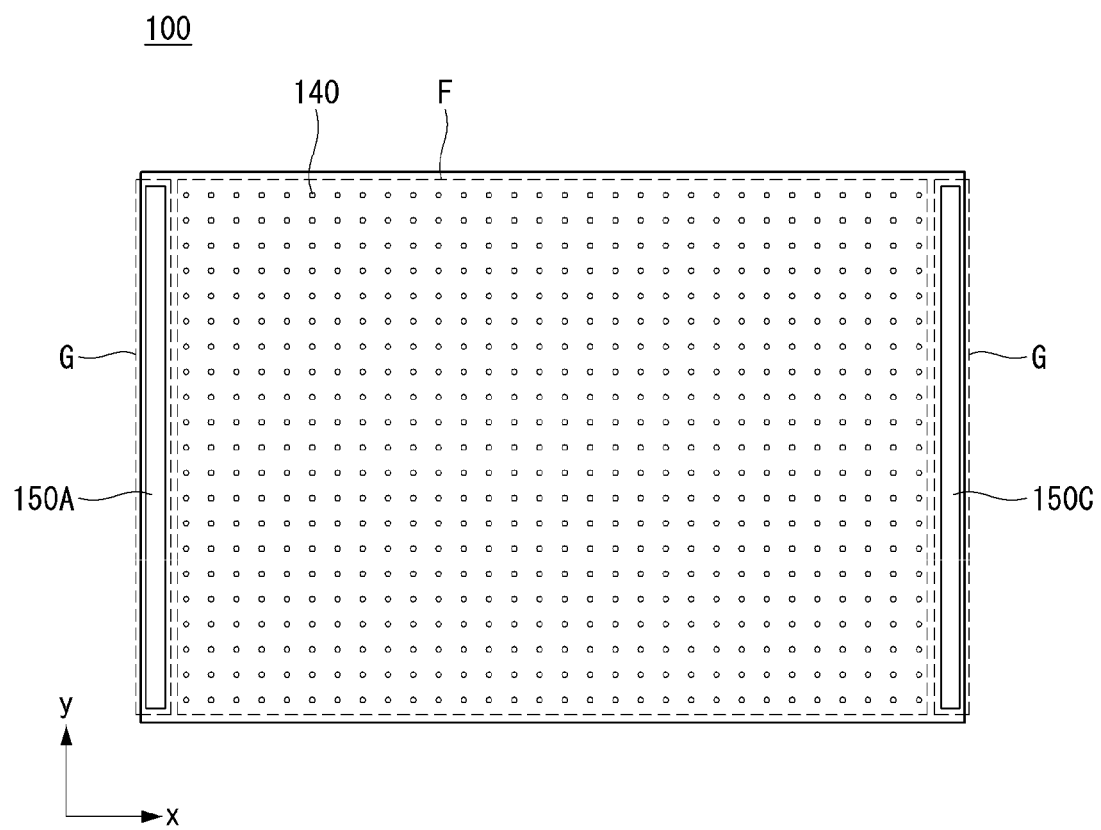

Referring to FIG. 4, the connectors 150A and 150C may be disposed along one side of the display device 100 and other side in parallel with the one side. Alternatively, the connectors 150A and 150C may include a left connector 150A and a right connector 150C, and the left connector 150A and the right connector 150C may be disposed opposite each other.

The plurality of light source assemblies 140 may be disposed between the left connector 150A and the right connector 150C. The display area F may be disposed between the left connector 150A and the right connector 150C. Alternatively, the display area F may be disposed between the bezel areas G.

In contrast to the case of FIG. 3, the ratio of the bezel area G becomes smaller and the ratio of the display area F becomes larger. Therefore, it may be advantageous to display a large screen compared to an area of the display device 100.

Figure 5:
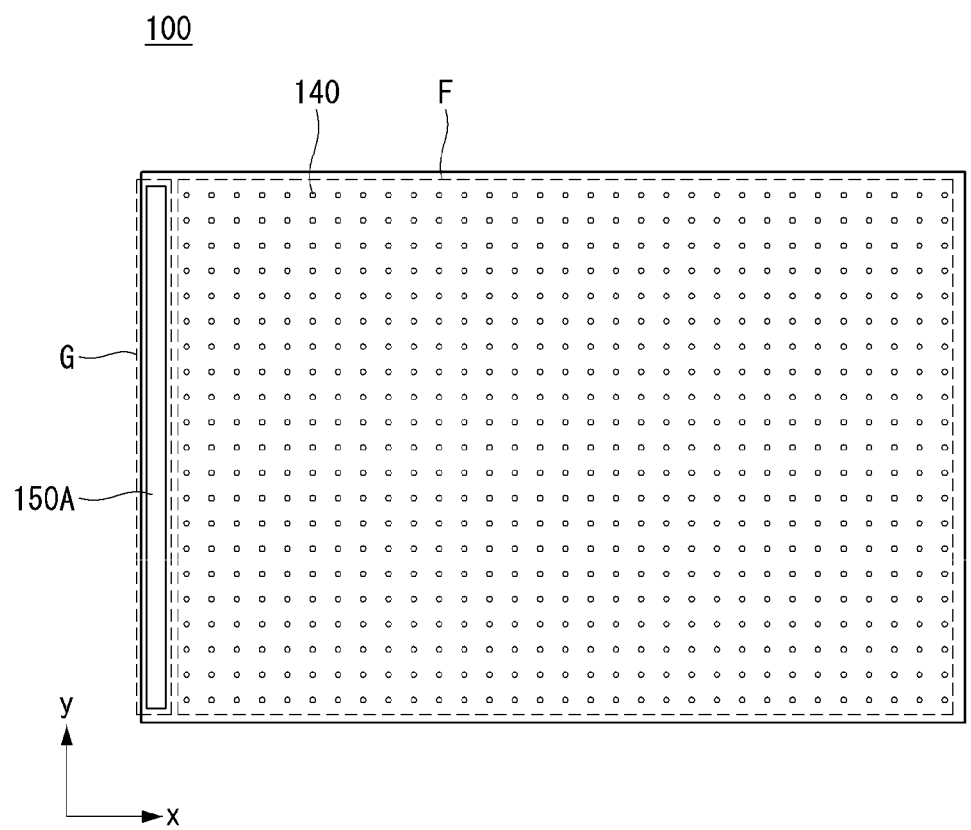

Referring to FIG. 5, the connector 150A may be disposed along one side of the display device 100. The light source assemblies 140 may be disposed in an area where the connector 150A is not disposed. The connector 150A disposed at the one side of the display device 100 can supply the power to all the light source assemblies 140. In addition, the connector 150A disposed at the one side of the display device 100 can transmit the control signals to all the light source assemblies 140.

In contrast to the case of FIGS. 3 and 4, the ratio of the bezel area G becomes smaller and the ratio of the display area F becomes larger. Therefore, it may be advantageous to display a large screen compared to the area of the display device 100.

However, an efficient connector 150A structure or an efficient display device 100 wiring structure may be required in order to supply the power and transmit the control signal to the light source assemblies 140 through the relatively reduced connector 150A.

Figure 6:
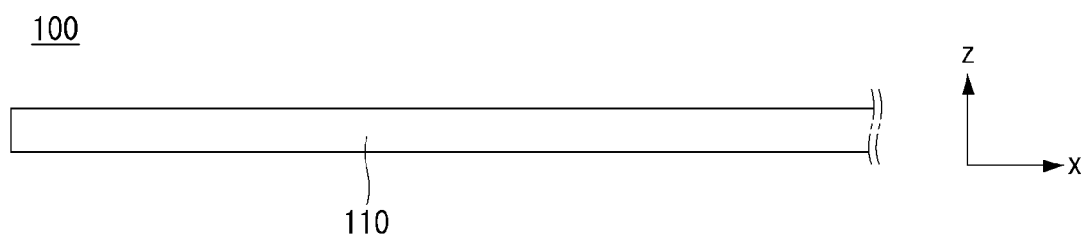

Referring to FIG. 6, the display device 100 may include a base 110. The base 110 may be referred to as a substrate 110, a transparent substrate 110, a plate 110, or a transparent plate 110. The base 110 may be made of a transparent material. Alternatively, the base 110 may have light transmission. A thickness of the base 110 may be very thin. For example, the thickness of the base 110 may be 250 um.

The base 110 may have insulating properties. The power supplied to the display device 100 can be blocked without passing through the base 110.

Heat may be applied to the base 110 during production process of the display device 100. For example, the base 110 may comprise a polyethylene terephthalate (PET) material. When the thickness of the base 110 becomes sufficiently thick, it is possible to prevent the base 110 from being thermally deformed even when heat of 200 degrees or more is applied to the base 110 during the production process of the display device 100.

Figure 7:
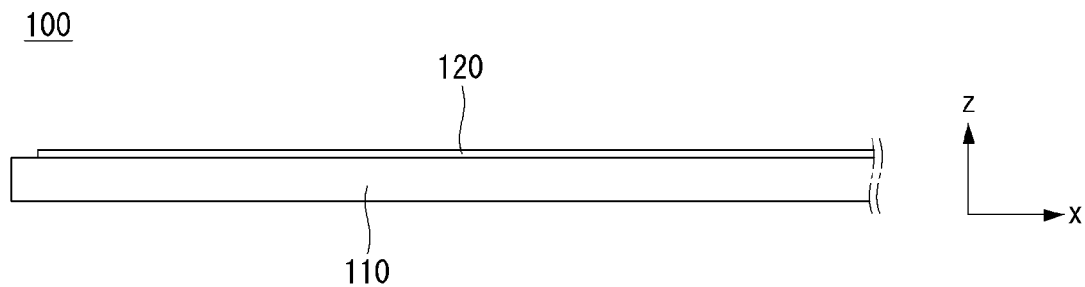

Referring to FIG. 7, an electrode layer 120 may be formed on the base 110. The electrode layer 120 may be referred to as an electrode 120 or a metal electrode 120. The electrode layer 120 may have conductivity. The electrode layer 120 can function as a path for transmitting the power supplied from the power supply unit. Further, the electrode layer 120 can function as a path for transmitting the control signal transmitted from the controller.

The electrode layer 120 may be coated on the base 110. In addition, the electrode layer 120 may be coated on the base 110 with a very thin thickness. The electrode layer 120 may have light transmission due to its thin thickness. Therefore, even if the electrode layer 120 is coated on the base 110, the display device 100 may have light transmission.

Figure 8:
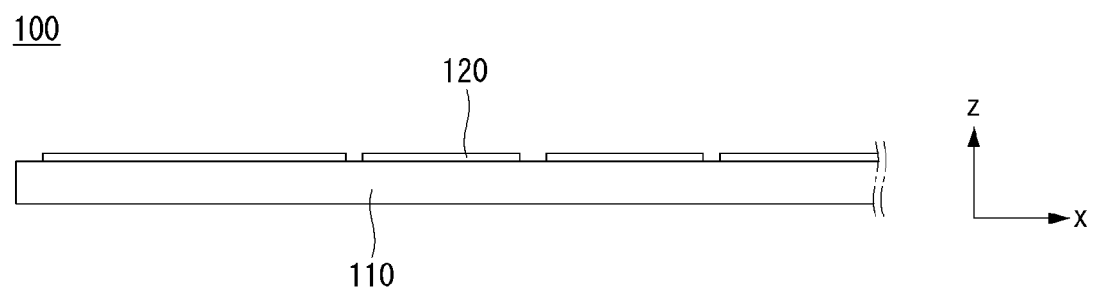

Referring to FIG. 8, the electrode layer 120 may form a pattern. The pattern of the electrode layer 120 can function as a wiring structure.

The pattern of the electrode layer 120 may be formed through an additional process after the electrode layer 120 is coated on the base 110. For example, the pattern of the electrode layer 120 may be formed by irradiating a laser beam onto the electrode layer 120 coated on the base 110. Alternatively, the pattern of the electrode layer 120 may be formed by etching the electrode layer 120 coated on the base 110.

For example, the electrode layer 120 may include metal nano wires. The electrode layer 120 may include silver (Ag) nano wires. The silver (Ag) nano wires have high conductivity and can be excellent in light transmission.

For example, the electrode layer 120 may include silver. The electrode layer 120 may have a mesh shape formed of silver. The silver can have high conductivity.

For example, the electrode layer 120 may include copper. The electrode layer 120 may have a mesh shape formed of copper. The copper can have high conductivity.

For example, the electrode layer 120 may include nickel and chromium-plated copper. The electrode layer 120 may have a mesh shape formed of nickel and chromium-plated copper. The nickel and chromium-plated copper can have high conductivity.

The electrode layer 120 may include copper oxide. Copper can be reddish and copper oxide can be black. The display device 100 may be grayed by including the copper oxide electrode layer 120.

A sheet resistance of the copper mesh electrode may be smaller than a sheet resistance of the silver mesh electrode. The sheet resistance of the silver mesh electrode may be smaller than a sheet resistance of the silver nano wires. When light is incident on the base 110 on which the electrode layer 120 is formed, the light can be transmitted through the base 110. At this time, a ratio of the transmitted light to the incident light can be referred to as a transmittance. The higher the transmittance, the more light can be transmitted. A transmittance of the nickel and chromium-plated copper electrodes may be higher than a transmittance of the copper mesh electrodes. A transmittance of the silver mesh electrode may be higher than a transmittance of the silver nano wire electrode. The transmittance of the silver nano wire electrode may be higher than that of the copper mesh electrode.

Figure 9:
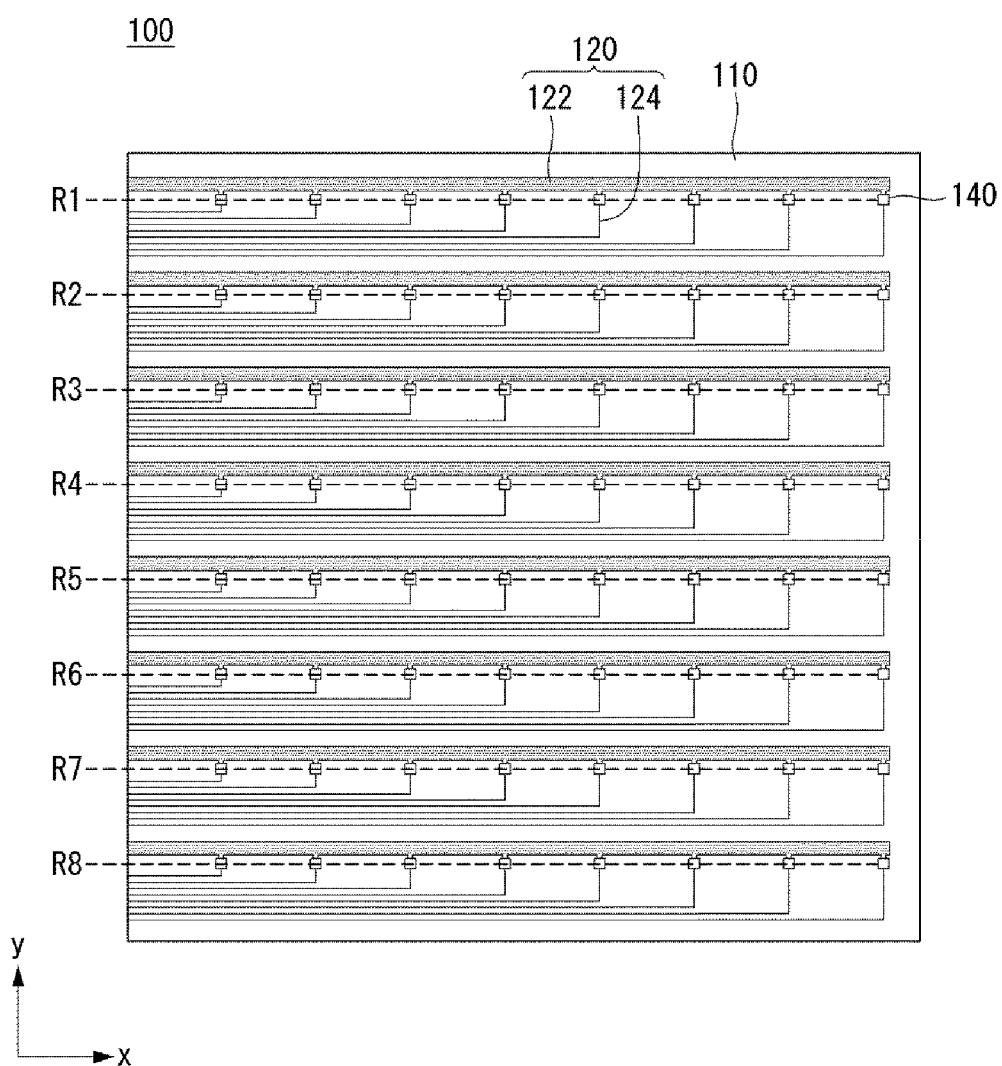

Referring to FIG. 9, the display device 100 may include a light source assembly 140. The light source assembly 140 may be installed on the base 110. In addition, the light source assembly 140 may be electrically connected to the electrode layer 120.

The electrode layer 120 may include a positive electrode 122 and a negative electrode 124. The positive electrode 122 may be referred to as a positive electrode, an oxidation electrode, or an anode. The negative electrode 124 may be referred to as a negative electrode, a reduction electrode, or a cathode.

The light source assembly 140 may be installed in a plurality of units. The plurality of light source assemblies 140 may be disposed along one side of the base 110 and may form one row. The plurality of light source assemblies 140 forming the one row may be spaced apart from each other. Alternatively, the plurality of light source assemblies 140 forming the one row may be disposed at regular intervals.

A plurality of rows R1, R2, R3, R4, R5, and R6 formed by the plurality of light source assemblies 140 may be formed. The rows R1, R2, R3, R4, R5, and R6 each may be disposed along one side of the base 110. Also, the rows R1, R2, R3, R4, R5, and R6 each may be spaced apart from each other. Alternatively, the rows R1, R2, R3, R4, R5, and R6 each may be disposed at equal intervals from each other.

The positive electrode 122 may extend along the one row. The positive electrode 122 may be electrically connected to each of the plurality of light source assemblies 140 in the one row. The positive electrode 122 may be located above the one row.

The negative electrode 124 may extend along the one row. The negative electrode 124 may be electrically connected to each of the plurality of light source assemblies 140 in the one row. The negative electrode 124 may be located below the one row. That is, the one row may be located between the positive electrode 122 and the negative electrode 124.

The positive electrode 122 connected to the one row may be formed of one electrode. The plurality of light source assemblies 140 in the one row may be connected to one positive electrode 122. The plurality of negative electrodes 124 connected to the one row may be formed. The negative electrode 124 may be formed to correspond to each of the plurality of light source assemblies 140 in the one row.

Figure 10:
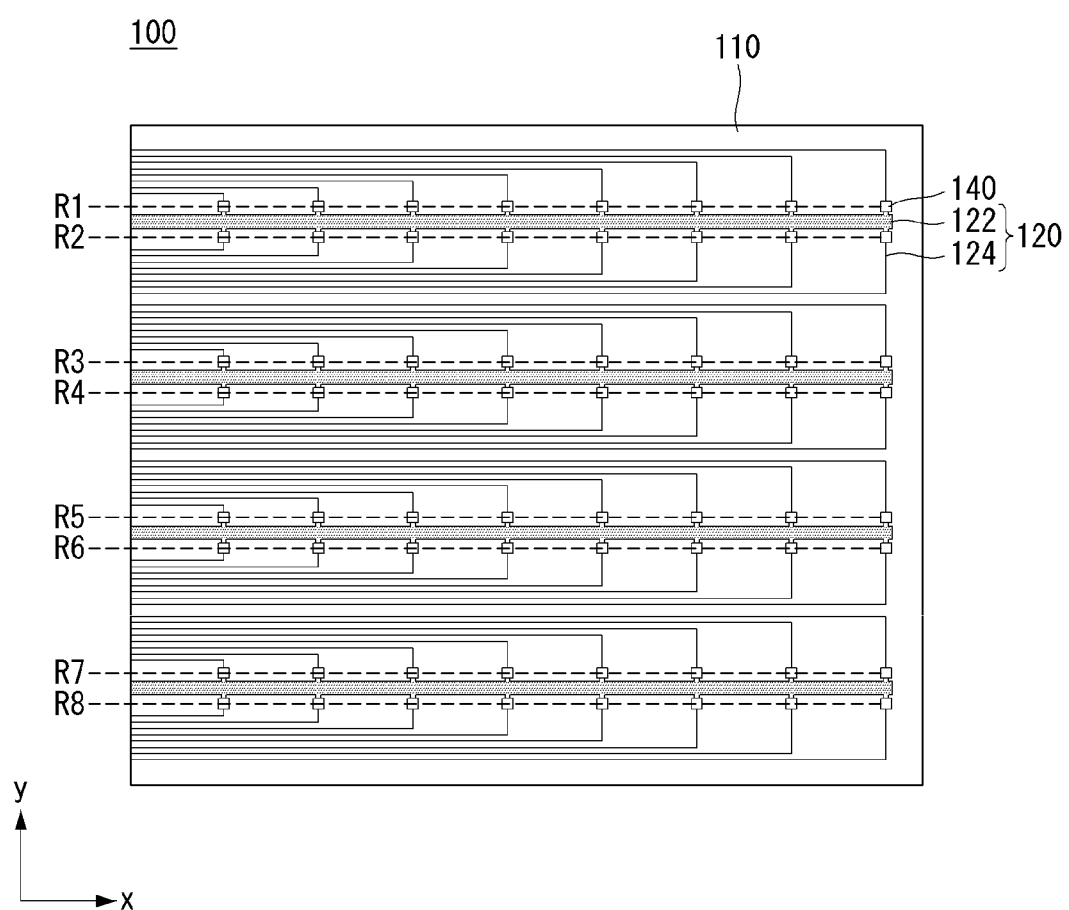

Referring to FIG. 10, a positive electrode 122 may be disposed between a first row R1 and a second row R2. Alternatively, the positive electrode 122 may be disposed between a third row R3 and a fourth row R4. Alternatively, the positive electrode 122 may be disposed between a fifth row R5 and a sixth row R6. Alternatively, the positive electrode 122 may be disposed between a seventh row R7 and an eighth row R8.

Each of the plurality of light source assemblies 140 in the first row R1 may be electrically connected to one positive electrode 122 disposed between the first row R1 and the second row R2. Each of the plurality of light source assemblies 140 in the second row R2 may be electrically connected to one positive electrode 122 disposed between the first row R1 and the second row R2.

A negative electrode 124 electrically connected to the first row R1 may be disposed above the first row R1. The negative electrode 124 may be formed to correspond to each of the plurality of light source assemblies 140 in the first row R1.

The negative electrode 124 electrically connected to the second row R2 may be disposed below the second row R2. The negative electrode 124 may be formed to correspond to each of the plurality of light source assemblies 140 in the second row R2.

A connection structure of the positive electrode 122 electrically connected to the third row R3 and the fourth row R4, the negative electrode 124 electrically connected to the third row R3, and the negative electrode 124 electrically connected to the fourth row R4 may be the same as the connection structure of the first row R1, the second row R2, the positive electrode 122, and the negative electrode 124 described above.

A connection structure of the fifth row R5 and the sixth row R6 and a connection structure of the seventh row R7 and the eighth row R8 may be the same as the connection structure of the first row R1 and the second row R2.

Figure 11:
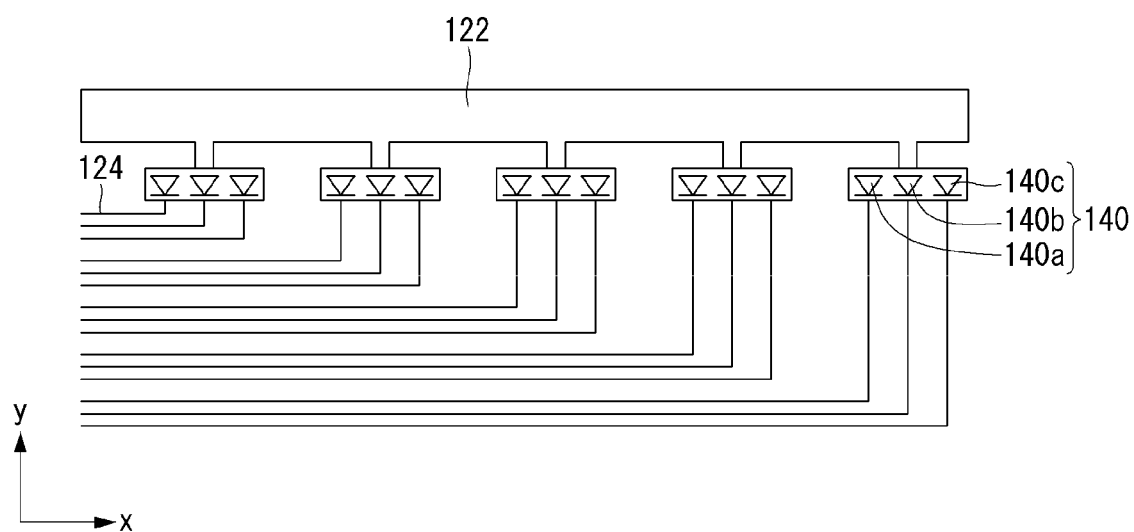

Referring to FIG. 11, the light source assembly 140 may include a plurality of LED chips 140*a*, 140*b*, and 140*c*. For example, the light source assembly 140 may include at least one of a red LED chip 140*a*, a green LED chip 140*b*, and a blue LED chip 140*c*. The light source assembly may be referred to as a light source or a chip. The LED chips may be referred to as chips.

The plurality of light source assemblies 140 may be electrically connected to one positive electrode 122, respectively. The negative electrodes 124 connected to the respective light source assemblies 140 may be independent of each other. Further, the negative electrode 124 electrically connected to the respective light source assemblies 140 may include three electrodes. The three electrodes may be electrically connected to the red LED chip 140*a*, the green LED chip 140*b*, and the blue LED chip 140*c*, respectively. Thereby, the LED chips 140*a*, 140*b*, 140*c* of the light source assembly 140 can be individually controlled.

Figure 12:
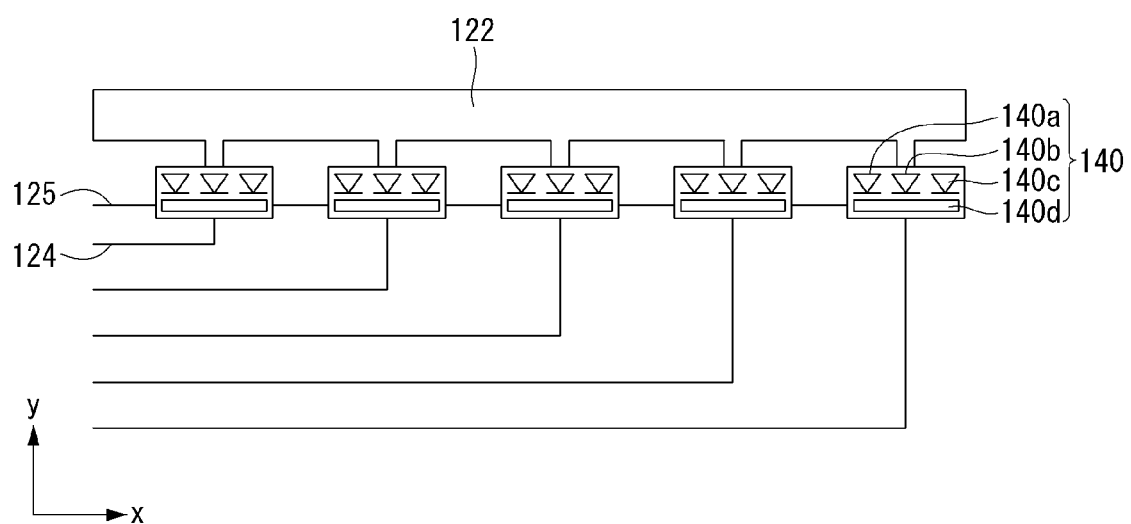
Figure 13:
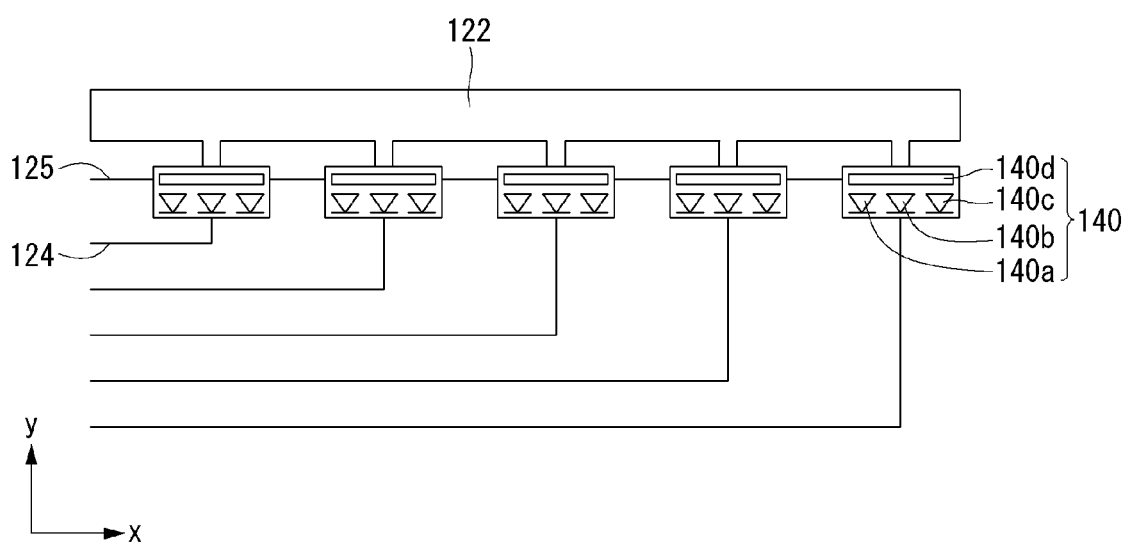

Referring to FIGS. 12 and 13, the light source assembly 140 may include at least one of a plurality of LED chips 140*a*, 140*b*, and 140*c* or an IC chip 140*d*. The IC chip may be referred to as a chip. The electrode layer 120 may include at least one of a positive electrode 122, a negative electrode 124, and a control electrode 125. The positive electrode 122 may be referred to as an electrode. Alternatively, the negative electrode 124 may be referred to as an electrode. Alternatively, the control electrode 125 may be referred to as an electrode. Alternatively, the control electrode 125 may be referred to as a switching electrode.

The control electrode 125 may electrically connect neighboring light source assemblies 140 to each other. In addition, the control electrode 125 may connect the neighboring light source assemblies 140 in series. The control electrode 125 may transmit a signal for controlling the IC chip 140*d* of the light source assembly 140.

The plurality of light source assemblies 140 may be electrically connected to one positive electrode 122, respectively. The negative electrodes 124 connected to the respective light source assemblies 140 may be independent of each other. Further, the negative electrode 124 electrically connected to the respective light source assemblies 140 may be one electrode. Even if the negative electrode 124 is not connected to each of the plurality of LED chips 140*a*, 140*b*, and 140*c* included in the light source assembly 140, the plurality of LED chips 140*a*, 140*b* and 140*c* can be individually controlled through the IC chip 140*d*.

A current supplied through a power supply unit may flow in order of the positive electrode 122, the plurality of LED chips 140*a*, 140*b* and 140*c*, the IC chip 140*d* and the negative electrode 12. Alternatively, the current supplied through the power supply unit may flow in order of the positive electrode 122, the IC chip 140*d*, the plurality of LED chips 140*a*, 140*b*, 140*c*, and the negative electrode 124.

Figure 14:
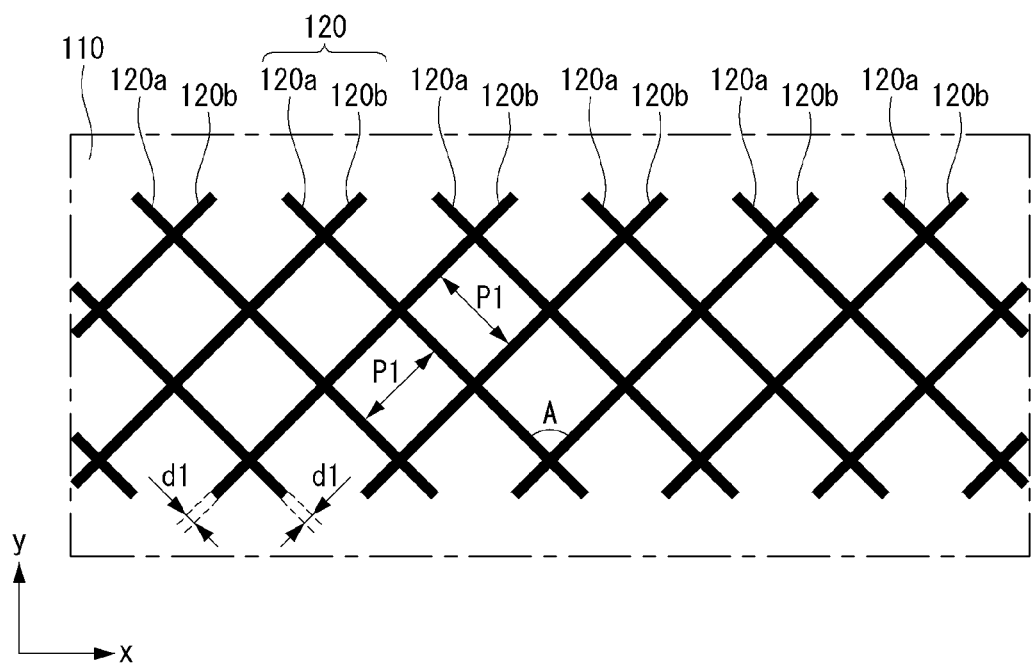

Referring to FIG. 14, an electrode layer 120 may include a first line 120*a* or a second line 120*b*. The first line 120*a* may have a line width d1. The first line 120*a* may be formed in a plurality. The plurality of first lines 120*a* may be disposed at equal intervals P1. The second line 120*b* may have a line width d1. The second line 120*b* may be formed in a plurality. The plurality of second lines 120*b* may be disposed at equal intervals P1. The plurality of first lines 120*a* and the plurality of second lines 120*b* may intersect each other. The plurality of first lines 120*a* and the plurality of second lines 120*b* may form a mesh shape. Alternatively, the plurality of first lines 120*a* and the plurality of second lines 120*b* may form a diamond structure. Alternatively, the plurality of first lines 120*a* and the plurality of second lines 120*b* may form a square or a rhombus. An angle formed by the first line 120*a* and the second line 120*b* may be A. For example, A may be a right angle.

Figure 15:
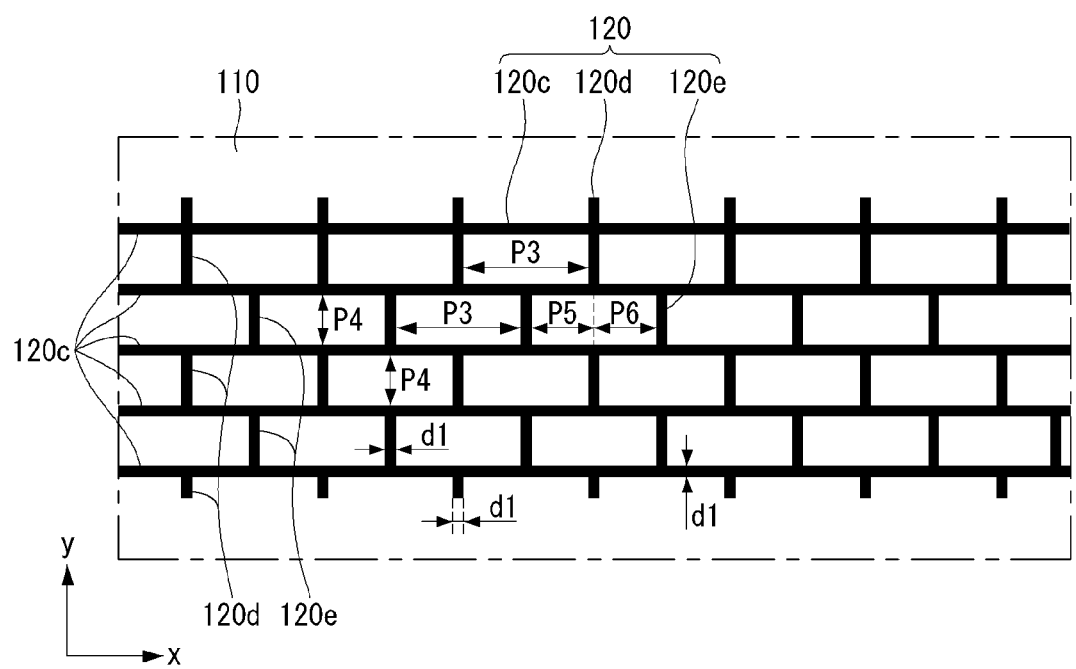

Referring to FIG. 15, an electrode layer 120 may include at least one of a first line 120*c*, a second line 120*d*, and a third line 120*e*. The first line 120*c* may extend along a longitudinal direction of the electrode layer 120. The first line 120*c* may have a line width d1. The first line 120*c* may be formed in a plurality. The plurality of first lines 120*c* may be disposed at equal intervals P4. The second line 120*d* may have a line width d1. The second line 120*d* may be formed in a plurality. The second line 120*d* may connect neighboring first lines 120*c*. The plurality of second lines 120*d* may be disposed at equal intervals P3 along the longitudinal direction of the electrode layer 120. The plurality of first lines 120*c* and the plurality of second lines 120*d* may intersect with each other. The third line 120*e* may be formed in a plurality. The third line 120e may connect the neighboring first lines 120c. A plurality of third lines 120e may be disposed at equal intervals P3 along the longitudinal direction of the electrode layer 120. The plurality of first lines 120c, the plurality of second lines 120d, and the plurality of third lines 120e may intersect with each other. The plurality of first lines 120c, the plurality of second lines 120d, and the plurality of third lines 120e may form a mesh shape. Alternatively, the plurality of first lines 120c, the plurality of second lines 120d, and the plurality of third lines 120e may form a brick structure. Alternatively, the plurality of first lines 120c, the plurality of second lines 120d, and the plurality of third lines 120e may form a quadrangle.

Figure 16:
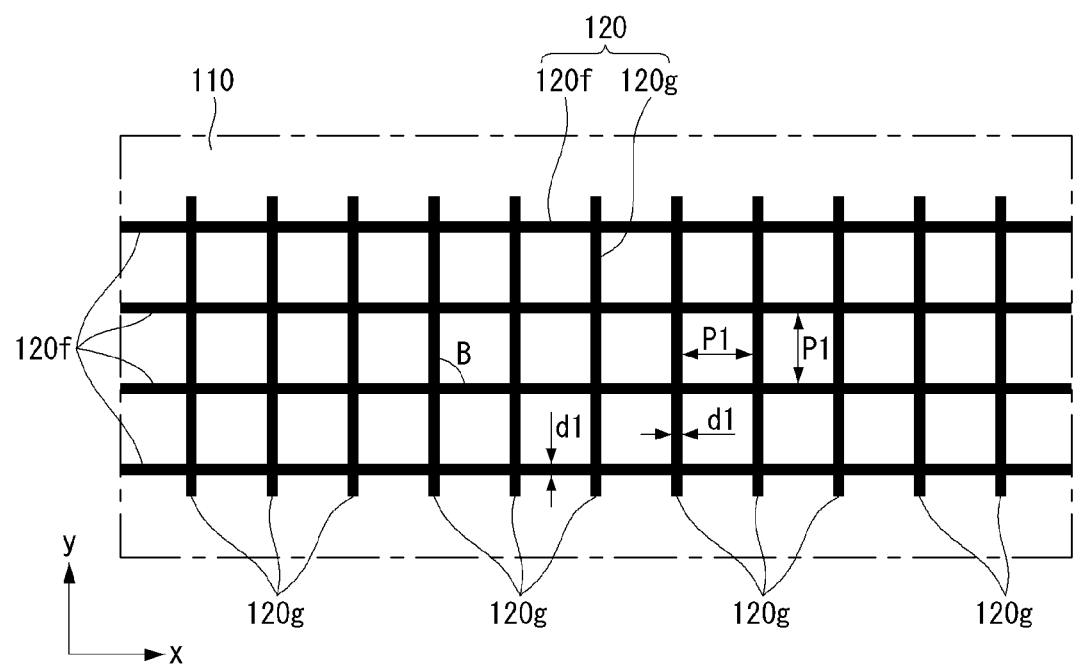

Referring to FIG. 16, an electrode layer 120 may include a first line 120f or a second line 120g. The first line 120f may extend along the longitudinal direction of the electrode layer 120. The first line 120f may have a line width d1. The first line 120f may be formed in a plurality. The plurality of first lines 120f may be disposed at equal intervals P1. The second line 120g may have a line width d1. The second line 120g may be formed in a plurality. The plurality of second lines 120g may be disposed at equal intervals P1 along the longitudinal direction of the electrode layer 120. The plurality of first lines 120f and the plurality of second lines 120g may intersect with each other. The plurality of first lines 120f and the plurality of second lines 120g may be orthogonal. The plurality of first lines 120f and the plurality of second lines 120g may form a mesh shape. Alternatively, the plurality of first lines 120f and the plurality of second lines 120g may form a square structure. Alternatively, the plurality of first lines 120f and the plurality of second lines 120g may form a quadrangle or a square. An angle formed by the first line 120f and the second line 120g may be B. For example, B may be a right angle.

When an electrode layer is formed of the same metal material, the same pitch, and the same line width, a sheet resistance of a diamond mesh shape and a sheet resistance of a square mesh shape may be the same. However, in contrast to a path through which a current supplied from the power supply unit is transmitted to a chip connected to the electrode layer, a path of the diamond mesh shape may be longer than a path of the square mesh shape. Therefore, the square mesh shape may have less power loss than the diamond mesh shape. Further, the transmittance of the diamond mesh shape may be higher than that of the square mesh shape.

When the electrode layer is formed of the same metal material and the same line width, a sheet resistance of a brick mesh shape may be higher than that of the square mesh shape. The transmittance of the brick mesh shape may be substantially the same as the transmittance of the square mesh shape.

Figure 17:
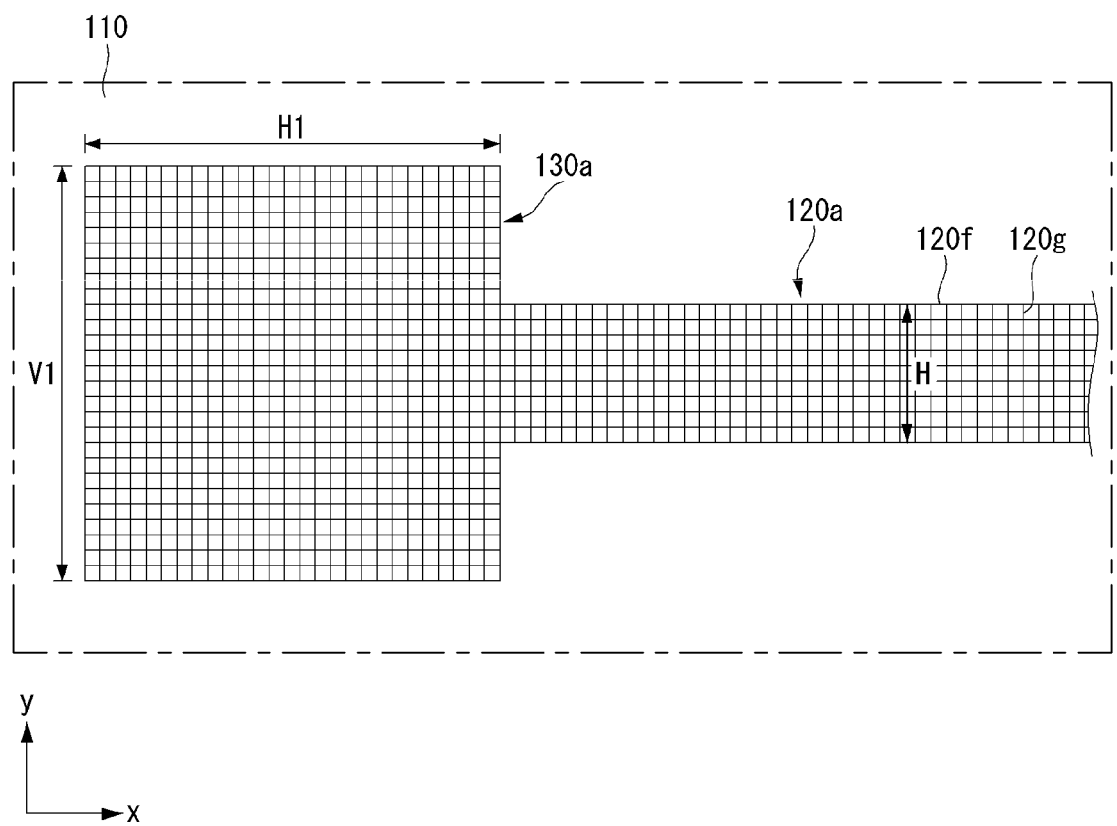

Referring to FIG. 17, a pad 130a may be connected to one side of an electrode layer 120a. The pad 130a may be referred to as a metal pad 130a. The pad 130a may be physically or electrically connected to the electrode layer 120a. A chip, a light source assembly, or an electronic component may be physically or electrically connected to the pad 130a. A material of the pad 130a may be the same as that of the electrode layer 120a. The pad 130a may have a horizontal line H1 and a vertical line V1. A horizontal direction of the pad 130a may be the same as a longitudinal direction of the electrode layer 120a. The pad 130a may be formed integrally with the electrode layer 120a. The electrode layer 120a may include a mesh shape. The pad 130a may include a mesh shape. The mesh shape of the electrode layer 120a and the mesh shape of the pad 130a may be continuously connected. Alternatively, a density of the mesh shape of the electrode layer 120a and a density of the mesh shape of the pad 130a may be the same. Alternatively, the number of mesh-shaped openings of the electrode layer 120a per unit area may be equal to the number of mesh-shaped openings of the pad 130a per unit area.

The electrode layer 120a may have a width H. The width H of the electrode layer 120a may be smaller than the vertical line V1 of the pad 130a. The electrode layer 120a may be connected to a central part of the vertical line V1 of the pad 130a.

The density of the mesh shape may mean the number of components per unit area. Alternatively, the density of the mesh shape may mean the number of lines forming a lattice per unit area.

Figure 18:
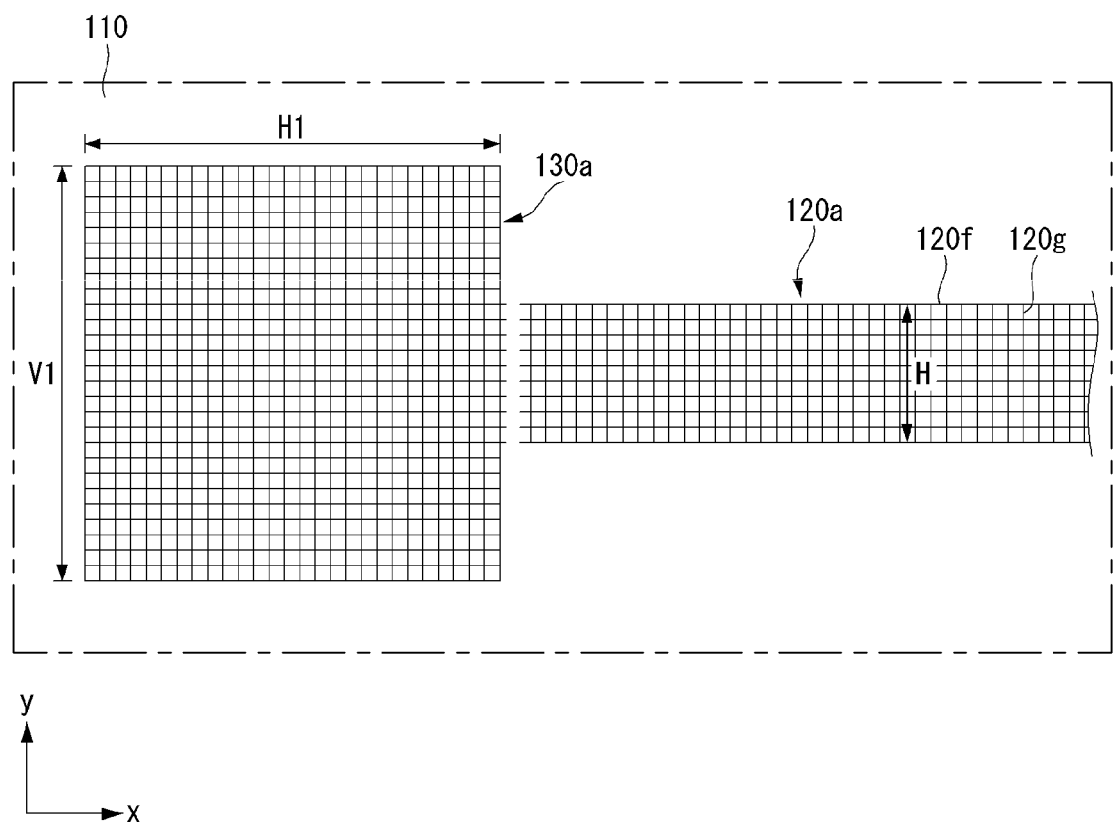

Referring to FIG. 18, a pad 130a and an electrode layer 120a may be disconnected. When an electronic component or the like is coupled onto the pad 130a, a part where the pad 130a and the electrode layer 120a are connected may receive more impact and disconnection may easily occur. When the electronic component or the like is coupled onto the pad 130a, flexibility of a region where the pad 130a is located and flexibility of a region where the pad 130a is not located may be different from each other. The region where the pad 130a is not located in the base 110 may be more flexible than the region where the pad 130a is located. Therefore, the flexibility of the base 110 may be partially changed, and thus disconnection of the part where the pad 130a and the electrode layer 120a are connected may easily occur.

Figure 19:
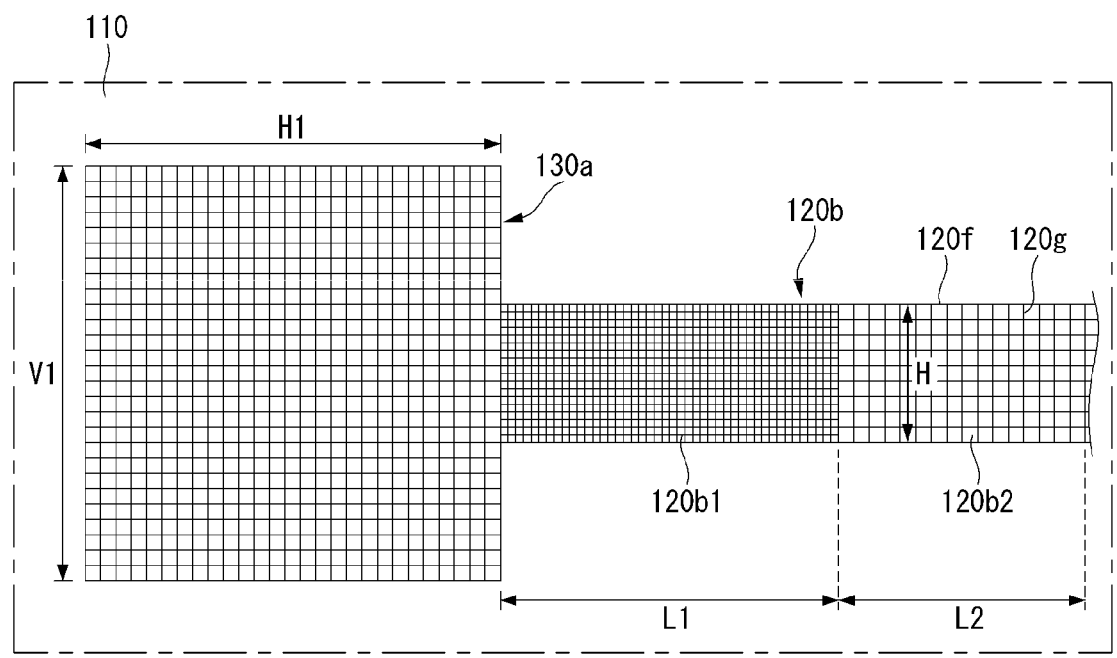

Referring to FIG. 19, an electrode layer 120b may include a first region 120b1 or a second region 120b2. The regions 120b1 and 120b2 may be referred to as parts 120b1 and 120b2. The first region 120b1 may be located between a pad 130a and the second region 120b2. The pad 130a may be physically or electrically connected to the first region 120b1. One side of the first region 120b1 may be physically or electrically connected to the pad 130a. Other side of the first region 120b1 may be physically or electrically connected to the second region 120b2. The first region 120b1 may have a length L1. The second region 120b2 may have a length L2.

A mesh shape of the pad 130a and a mesh shape of the first region 120b1 may be continuously connected. A density of the mesh shape of the first region 120b1 may be higher than a density of the mesh shape of the pad 130a. The density of the mesh shape of the first region 120b1 may be higher than a density of the mesh shape of the second region 120b2. The density of the mesh shape of the second region 120b2 may be the same as the density of the mesh shape of the pad 130a. Alternatively, the number of mesh-shaped openings of the first region 120b1 per unit area may be larger than the number of mesh-shaped openings of the pad 130a per unit area. The number of mesh-shaped openings of the first region 120b1 per unit area may be larger than the number of mesh-shaped openings of the second region 120b2 per unit area. The number of mesh-shaped openings of the pad 130a per unit area may be the same as the number of mesh-shaped openings of the second area 120b2. The length L2 may be greater than the length L1. The length L1 may be less than the length H1. Alternatively, the length L1 may be substantially equal to or greater than the length H1. As the length L1 becomes longer, connection strength between the pad 130a and the first region 120b1 can be increased. In contrast to FIGS. 17 and 19, in the case of FIG. 19, the number of first lines 120f connected to the pad 130a may be larger than that of FIG. 17. Therefore, in contrast to the case of FIG. 17, the disconnection between the pad 130a and the electrode layer 120b can be reduced.

Figure 20:
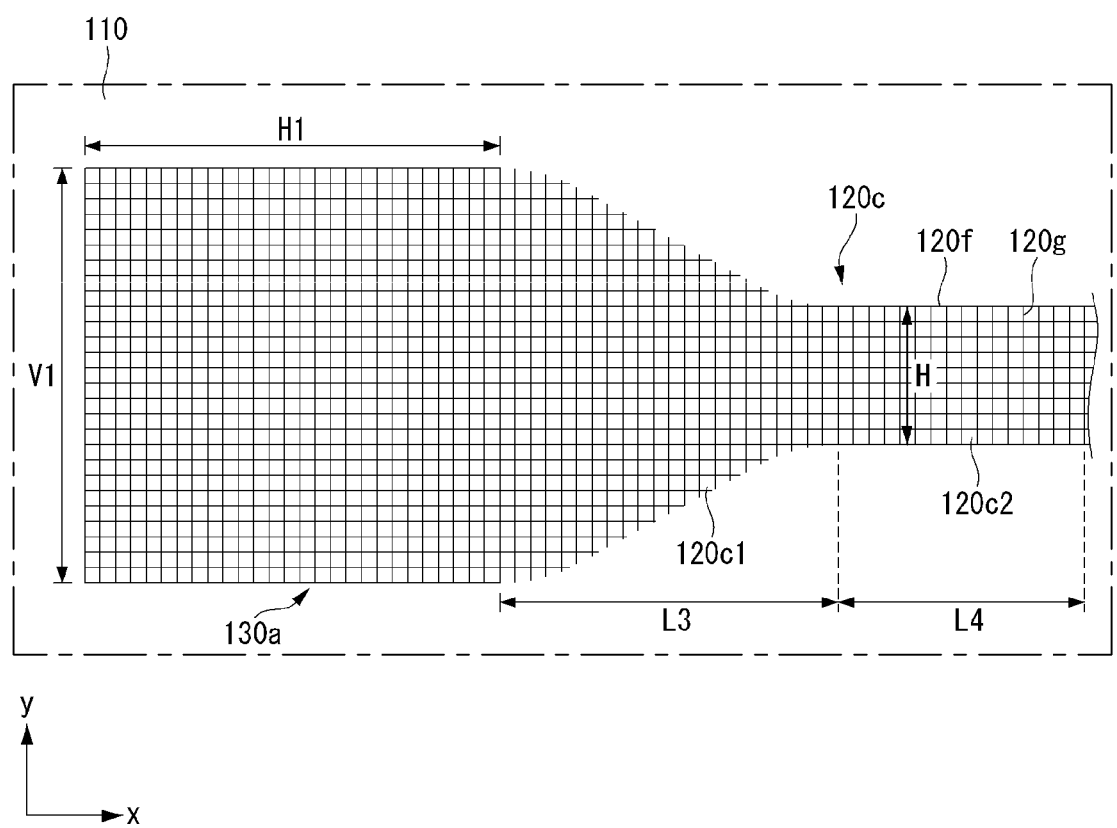

Referring to FIG. 20, an electrode layer 120c may include a first region 120c1 or a second region 120c2. The regions 120c1 and 120c2 may be referred to as parts 120c1 and 120c2. The first region 120c1 may be located between a pad 130a and the second region 120c2. The pad 130a may be physically or electrically connected to the first region 120c1. One side of the first region 120c1 may be physically or electrically connected to the pad 130a. Other side of the first region 120c1 may be physically or electrically connected to the second region 120c2. The first region 120c1 may have a length L3. The second region 120c2 may have a length L4. A vertical length of the one side of the first region 120c1 may be V1, and a vertical length of other side of the first region 120c1 may be H. The length V1 may be greater than the length H. The vertical length of the first region 120c1 may be reduced from the one side of the first region 120c1 to the other side of the first region 120c1.

A mesh shape of the pad 130a, a mesh shape of the first area 120c1, and a mesh shape of the second area 120c2 may be continuously connected. The mesh shape of the pad 130a, the mesh shape of the first region 120c1, and the mesh shape of the second region 120c2 may be the same in a density. Alternatively, the number of mesh-shaped openings of the pad 130a per unit area, the number of mesh-shaped openings of the first region 120c1 per unit area, and the number of openings of the mesh-shaped portion of the second region 120c2 per unit area may be equal to each other. The length L3 may be greater than the length L4. The length L3 may be less than the length H1. Alternatively, the length L3 may be substantially equal to or greater than the length H1. The longer the length L3, the higher the connection strength between the pad 130a and the first region 120c1. In contrast to FIG. 17 and FIG. 20, in the case of FIG. 20, the number of first lines 120f connected to the pad 130a may be larger than that of FIG. 17. Therefore, in contrast to the case of FIG. 17, disconnection between the pad 130a and the electrode layer 120c may be reduced.

Figure 21:
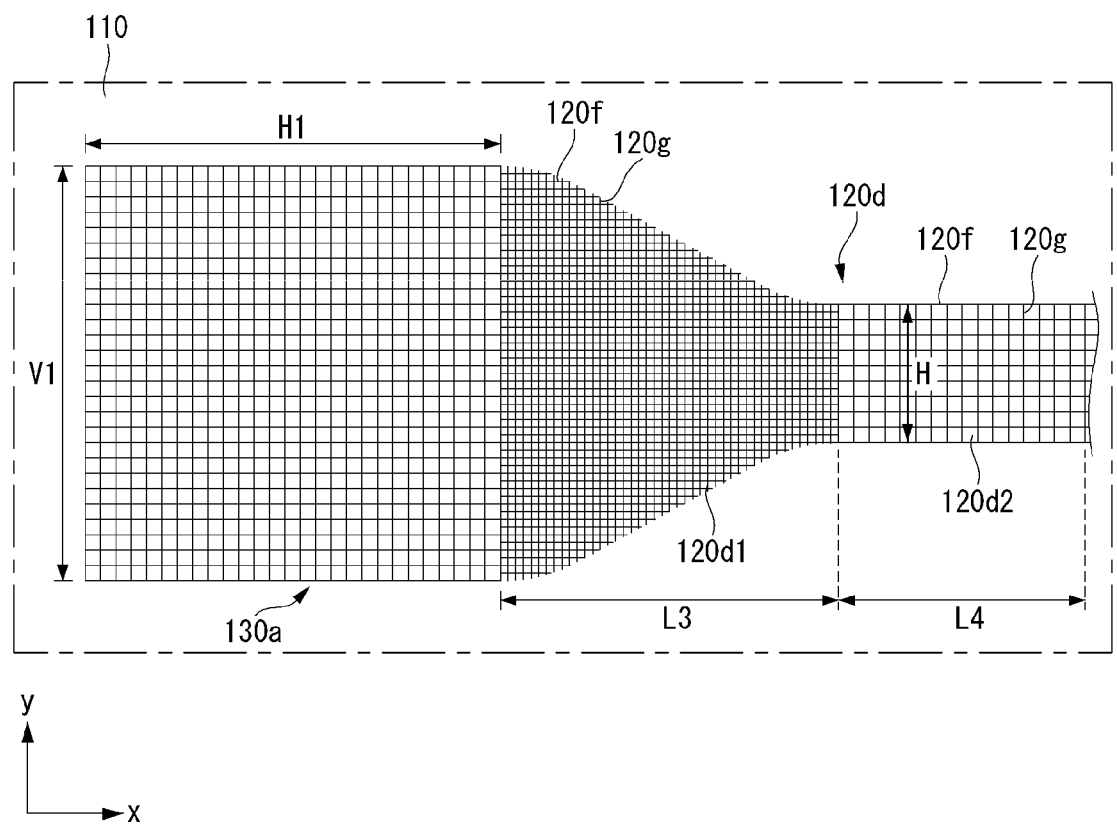

Referring to FIG. 21, an electrode layer 120d may include a first region 120d1 or a second region 120d2. The regions 120d1 and 120d2 may be referred to as parts 120d1 and 120d2. The first region 120d1 may be located between a pad 130a and the second region 120d2. The pad 130a may be physically or electrically connected to the first region 120d1. One side of the first region 120d1 may be physically or electrically connected to the pad 130a. Other side of the first region 120d1 may be physically or electrically connected to the second region 120d2. The first region 120d1 may have a length L3. The second region 120d2 may have a length L4. A vertical length of the one side of the first region 120d1 may be V1 and a vertical length of the other side of the first region 120d1 may be H. The length V1 may be greater than the length H. The vertical length of the first region 120d1 may be reduced from the one side of the first region 120d1 to the other side of the first region 120d1.

A mesh shape of the pad 130a and a mesh shape of the first region 120d1 may be continuously connected. A density of the mesh shape of the first region 120d1 may be higher than a density of the mesh shape of the pad 130a. The density of the mesh shape of the first region 120d1 may be higher than a density of the mesh shape of the second region 120d2. The density of the mesh shape of the second region 120d2 may be the same as the density of the mesh shape of the pad 130a. Alternatively, the number of mesh-shaped openings of the first region 120d1 per unit area may be larger than the number of mesh-shaped openings of the pad 130a per unit area. The number of mesh-shaped openings of the first area 120d1 per unit area may be larger than the number of mesh-shaped openings of the second area 120d2 per unit area. The number of mesh-shaped openings of the pad 130a per unit area may be the same as the number of mesh-shaped openings of the second area 120d2 per unit area. The length L4 may be greater than the length L3. The length L3 may be less than the length H1. Alternatively, the length L3 may be substantially equal to or greater than the length H1. The longer the length L3, the higher the connection strength between the pad 130a and the first region 120d1. In contrast to FIG. 17 and FIG. 21, in the case of FIG. 21, the number of first lines 120f connected to the pad 130a may be larger than that of FIG. 17. Therefore, in contrast to the case of FIG. 17, disconnection between the pad 130a and the electrode layer 120d may be reduced.

Figure 22:
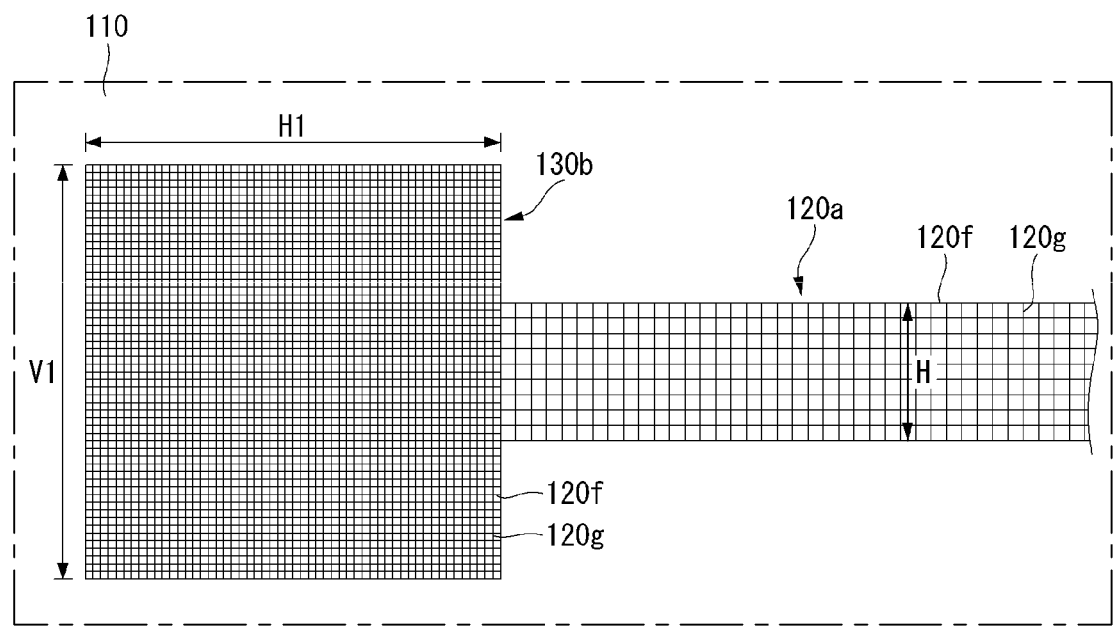

Referring to FIG. 22, a pad 130b may be connected to one side of an electrode layer 120a. The pad 130b may be referred to as a metal pad 130b. The pad 130b may be physically or electrically connected to the electrode layer 120a. A chip, a light source assembly, or an electronic component may be physically or electrically connected to the pad 130b. A material of the pad 130b may be the same as a material of the electrode layer 120a. The pad 130b may have a horizontal line H1 and a vertical line V1. A horizontal direction of the pad 130b may be the same as a longitudinal direction of the electrode layer 120a. The pad 130b may be formed integrally with the electrode layer 120a. The electrode layer 120a may include a mesh shape. The pad 130b may include a mesh shape. The mesh shape of the electrode layer 120a and the mesh shape of the pad 130b may be continuously connected. Alternatively, a density of the mesh shape of the pad 130b may be higher than a density of the mesh shape of the electrode layer 120a. Alternatively, the number of mesh-shaped openings of the electrode layer 120a per unit area may be smaller than the number of mesh-shaped openings of the pad 130b unit area.

The electrode layer 120a may have a width H. The width H of the electrode layer 120a may be smaller than the vertical line V1 of the pad 130b. The electrode layer 120a may be connected to a center part of the vertical line V1 of the pad 130b.

Figure 23:
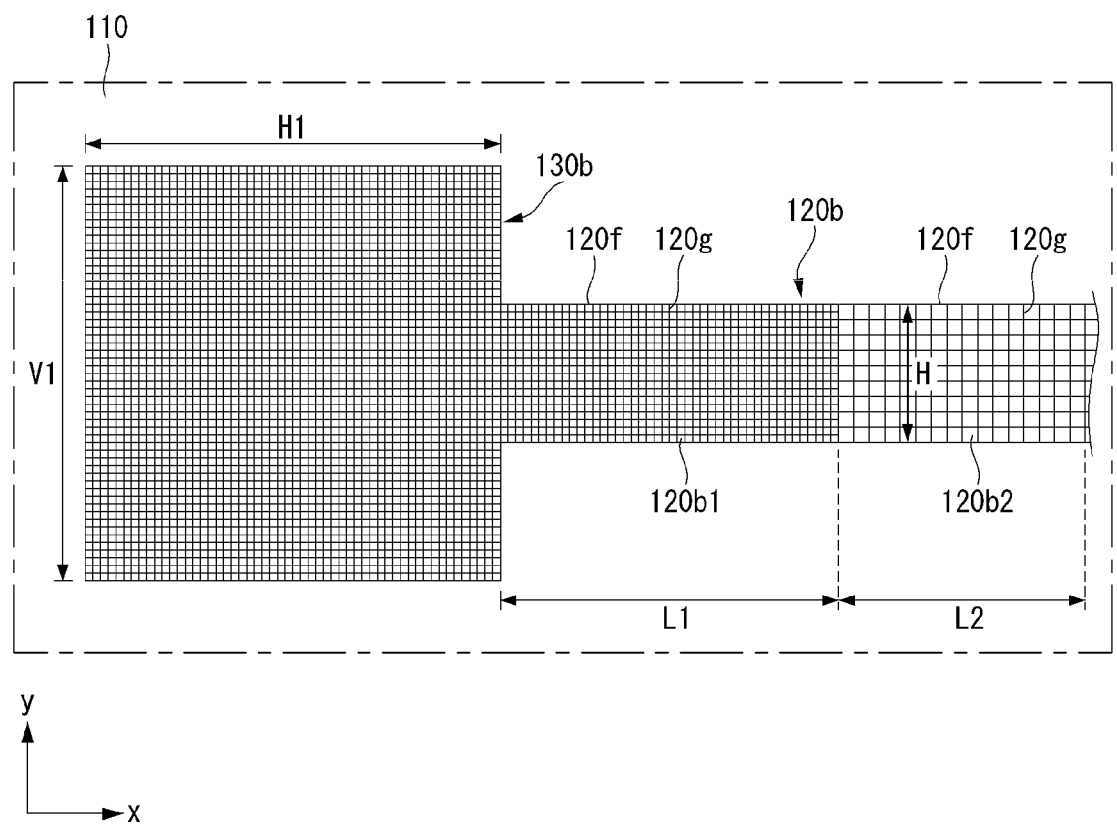

Referring to FIG. 23, an electrode layer 120b may include a first region 120b1 or a second region 120b2. The regions 120b1 and 120b2 may be referred to as parts 120b1 and 120b2. The first region 120b1 may be located between a pad 130b and the second region 120b2. The pad 130b may be physically or electrically connected to the first region 120b1. One side of the first region 120b1 may be physically or electrically connected to the pad 130b. Other side of the first region 120b1 may be physically or electrically connected to the second region 120b2. The first region 120b1 may have a length L1. The second region 120b2 may have a length L2.

A mesh shape of the pad 130b and a mesh shape of the first region 120b1 may be continuously connected. A density of the mesh shape of the first region 120b1 may be the same as a density of the mesh shape of the pad 130b. The density of the mesh shape of the first region 120b1 may be higher than a density of the mesh shape of the second region 120b2. The density of the mesh shape of the pad 130b may be higher than the density of the mesh shape of the second region 120b2. Alternatively, the number of mesh-shaped openings of the first region 120b1 per unit area may be equal to the number of mesh-shaped openings of the pad 130b per unit area. The number of mesh-shaped openings of the first area 120b1 per unit area may be larger than the number of mesh-shaped openings of the second area 120b2 per unit area. The number of mesh-shaped openings of the pad 130b per unit area may be larger than the number of mesh-shaped openings of the second area 120b1 per unit area. The length L2 may be greater than the length L1. The length L1 may be less than the length H1. Alternatively, the length L1 may be substantially equal to or greater than the length H1. The longer the length L1, the higher the connection strength between the pad 130b and the first region 120b1. In contrast to FIG. 22 and FIG. 23, in the case of FIG. 23, the number of first lines 120f connected to the pad 130b may be larger than that of FIG. 22. Accordingly, in contrast to the case of FIG. 22, disconnection of the pad 130b and the electrode layer 120b may be reduced.

Figure 24:
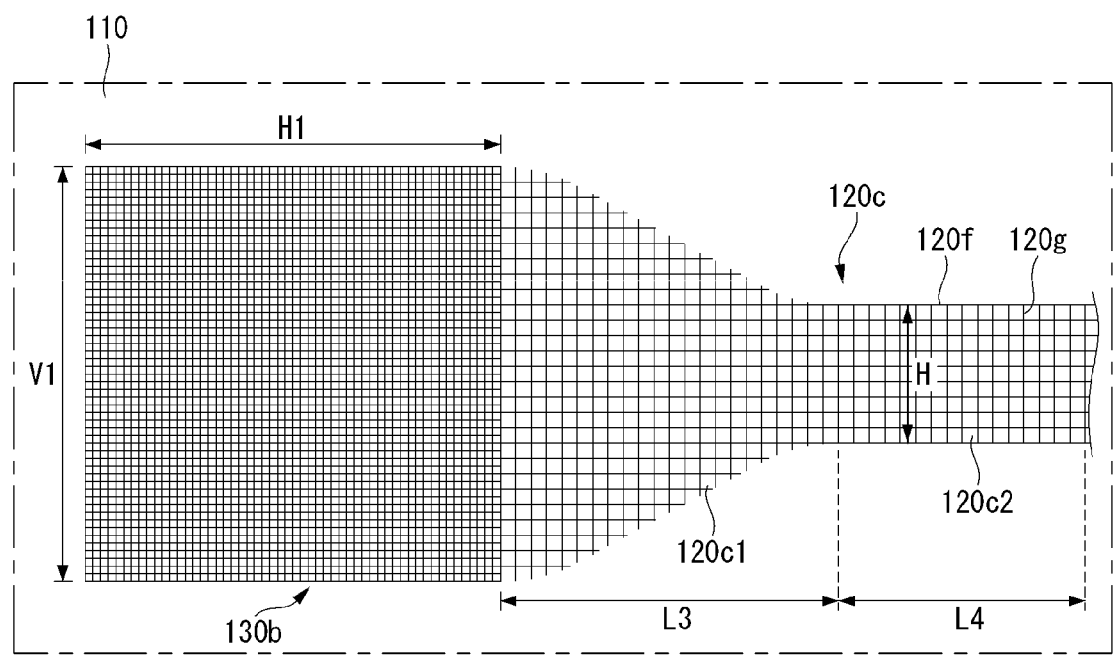

Referring to FIG. 24, an electrode layer 120c may include a first region 120c1 or a second region 120c2. The regions 120c1 and 120c2 may be referred to as parts 120c1 and 120c2. The first region 120c1 may be located between a pad 130b and the second region 120c2. The pad 130b may be physically or electrically connected to the first region 120c1. One side of the first region 120c1 may be physically or electrically connected to the pad 130b. Other side of the first region 120c1 may be physically or electrically connected to the second region 120c2. The first region 120c1 may have a length L3. The second region 120c2 may have a length L4. A vertical length of the one side of the first region 120c1 may be V1, and a vertical length of the other side of the first region 120c1 may be H. The length V1 may be greater than the length H. The vertical length of the first region 120c1 may be reduced from the one side of the first region 120c1 to the other side of the first region 120c1.

A mesh shape of the pad 130b, a mesh shape of the first region 120c1, and a mesh shape of the second region 120c2 may be continuously connected. A density of the mesh shape of the pad 130b may be higher than a density of the mesh shape of the electrode layer 120c. The mesh shape of the first region 120c1 and the mesh shape of the second region 120c2 may be the same. Alternatively, the number of mesh-shaped openings of the pad 130b per unit area may be larger than the number of mesh-shaped openings of the electrode layer 120c per unit area. The number of mesh-shaped openings of the pad 130b per unit area, the number of mesh-shaped openings of the first region 120c1 per unit area, and the number of mesh-shaped openings of the second region 120c2 per unit area may be equal to each other. The length L3 may be greater than the length L4. The length L3 may be less than the length H1. Alternatively, the length L3 may be substantially equal to or greater than the length H1. The longer the length L3, the higher the connection strength between the pad 130b and the first region 120c1. In contrast to FIG. 22 and FIG. 24, in the case of FIG. 24, the number of first lines 120f connected to the pad 130b may be larger than that of FIG. 22. Accordingly, in contrast to the case of FIG. 22, disconnection of the pad 130b and the electrode layer 120c may be reduced.

Figure 25:
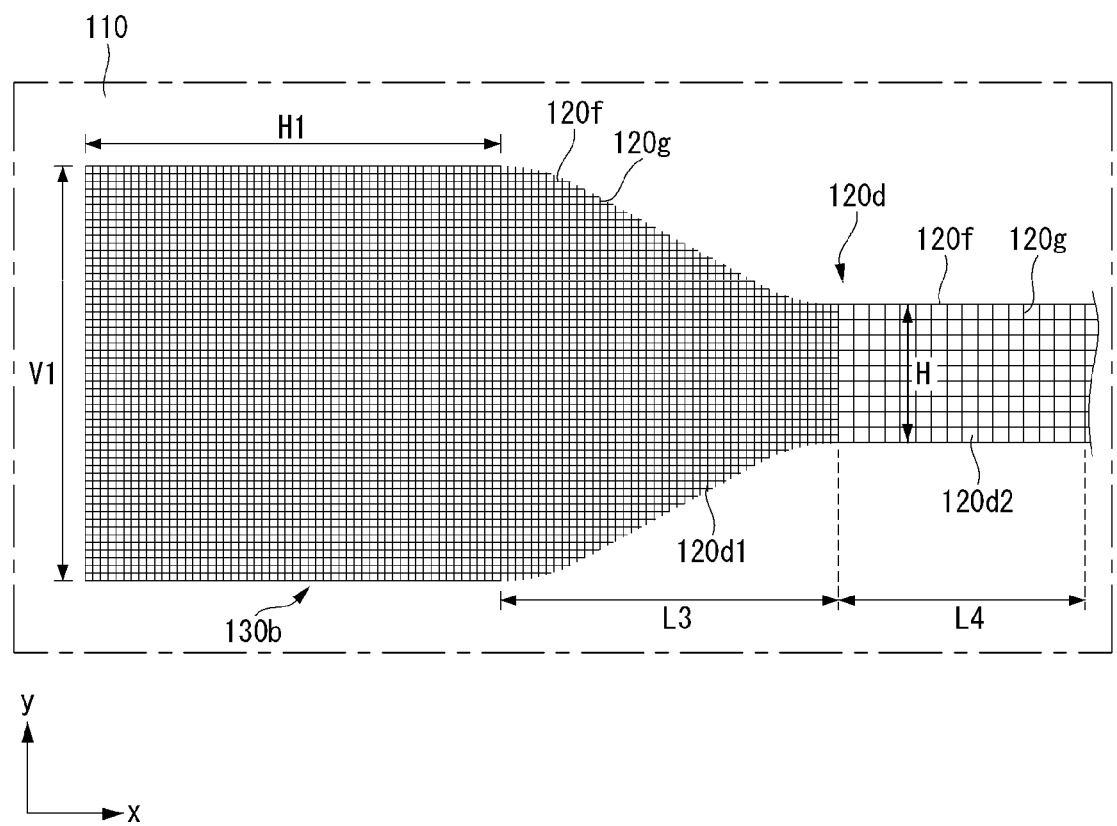

Referring to FIG. 25, an electrode layer 120d may include a first region 120d1 or a second region 120d2. The regions 120d1 and 120d2 may be referred to as parts 120d1 and 120d2. The first region 120d1 may be located between a pad 130b and the second region 120d2. The pad 130b may be physically or electrically connected to the first region 120d1. One side of the first region 120d1 may be physically or electrically connected to the pad 130b. Other side of the first region 120d1 may be physically or electrically connected to the second region 120d2. The first region 120d1 may have a length L3. The second region 120d2 may have a length L4. A vertical length of the one side of the first region 120d1 may be V1 and a vertical length of the other side may be H. The length V1 may be greater than the length H. The vertical length of the first region 120d1 may be reduced from the one side of the first region 120d1 to the other side of the first region 120d1.

A mesh shape of the pad 130b and a mesh shape of the first region 120d1 may be continuously connected. A density of the mesh shape of the first region 120d1 may be the same as a density of the mesh shape of the pad 130b. The density of the mesh shape of the first region 120d1 may be higher than a density of the mesh shape of the second region 120d2. Alternatively, the number of mesh-shaped openings of the first region 120d1 per unit area may be equal to the number of mesh-shaped openings of the pad 130b per unit area. The number of mesh-shaped openings of the first area 120d1 per unit area may be larger than the number of mesh-shaped openings of the second area 120d2 per unit area. The length L4 may be greater than the length L3. The length L3 may be less than the length H1. Alternatively, the length L3 may be substantially equal to or greater than the length H1. As the length L3 becomes longer, the connection strength between the pad 130b and the first region 120d1 can be increased. In contrast to FIGS. 22 and 25, in the case of FIG. 25, the number of first lines 120f connected to the pad 130b may be larger than that of FIG. 22. Accordingly, in contrast to the case of FIG. 22, disconnection of the pad 130b and the electrode layer 120d may be reduced.

Figure 26:
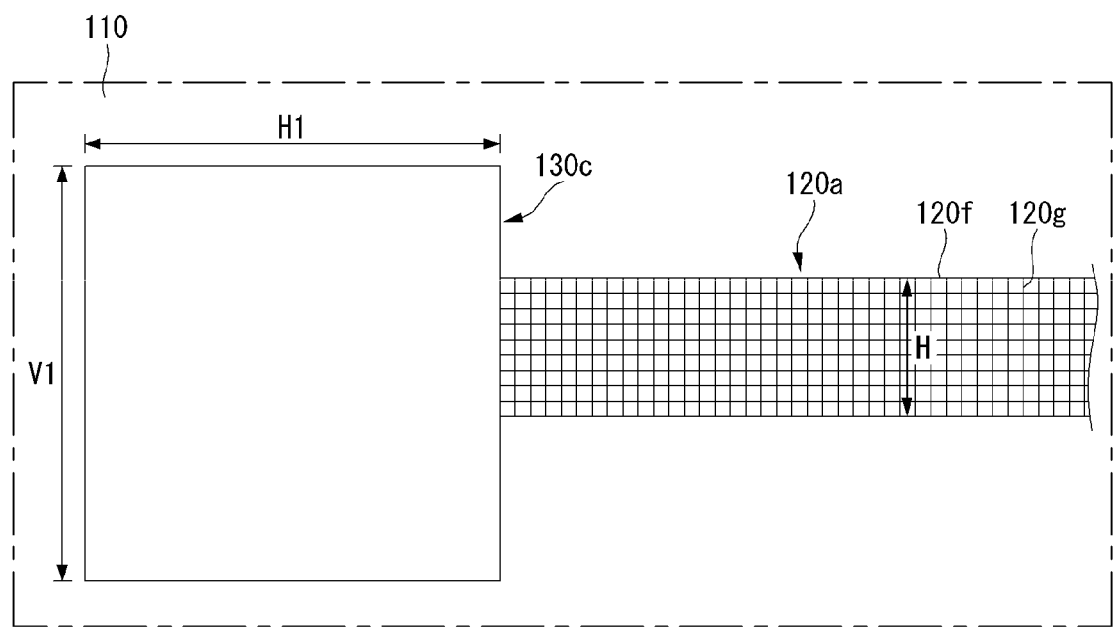

Referring to FIG. 26, a pad 130c may be connected to one side of an electrode layer 120a. The pad 130c may be referred to as a metal pad 130c. The pad 130c may be a metal film or a metal thin film formed on a base 110. For example, the pad 130c may be a film containing a copper material. The pad 130c may be physically or electrically connected to the electrode layer 120a. A chip, a light source assembly, or an electronic component may be physically or electrically connected to the pad 130c. A material of the pad 130c may be the same as that of the electrode layer 120a. The pad 130c may have a horizontal line H1 and a vertical line V1. A horizontal direction of the pad 130c may be the same as a longitudinal direction of the electrode layer 120a. The pad 130c may be formed integrally with the electrode layer 120a. The electrode layer 120a may include a mesh shape. The mesh shape of the electrode layer 120a and the pad 130c may be continuously connected. Alternatively, a density of the mesh shape of the electrode layer 120a may be uniform. Alternatively, the number of mesh-shaped openings of the electrode layer 120a per unit area may be kept the same throughout the electrode layer.

The electrode layer 120a may have a width H. The width H of the electrode layer 120a may be smaller than the vertical line V1 of the pad 130c. The electrode layer 120a may be connected to a center part of the vertical line V1 of the pad 130c.

Figure 27:
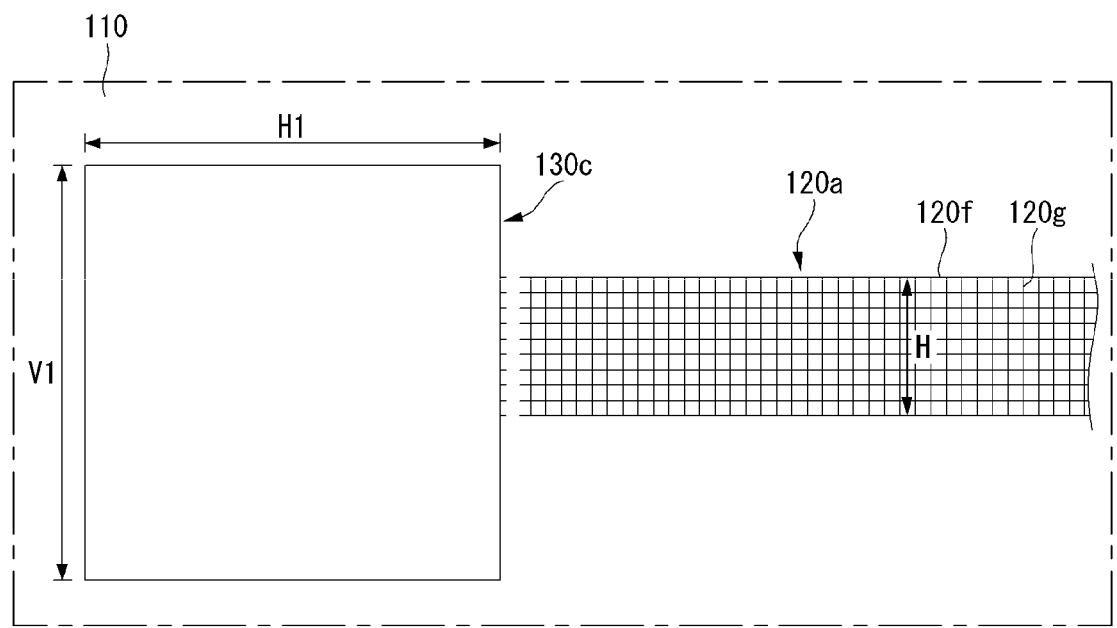

Referring to FIG. 27, a pad 130c and an electrode layer 120a may be disconnected. When an electronic component or the like is coupled onto the pad 130c, a part where the pad 130c and the electrode layer 120a are connected may receive more impact, and disconnection may easily occur. When the electronic component or the like is coupled onto the pad 130c, flexibility of a region where the pad 130c is located and flexibility of a region where the pad 130c is not located in the base 110 may be different from each other. In the base 110, the region where the pad 130c is not located may be more flexible than the region where the pad 130c is located. Accordingly, the flexibility of the base 110 may be partially varied, and thus the disconnection of the part where the pad 130c and the electrode layer 120a are connected may easily occur.

Figure 28:
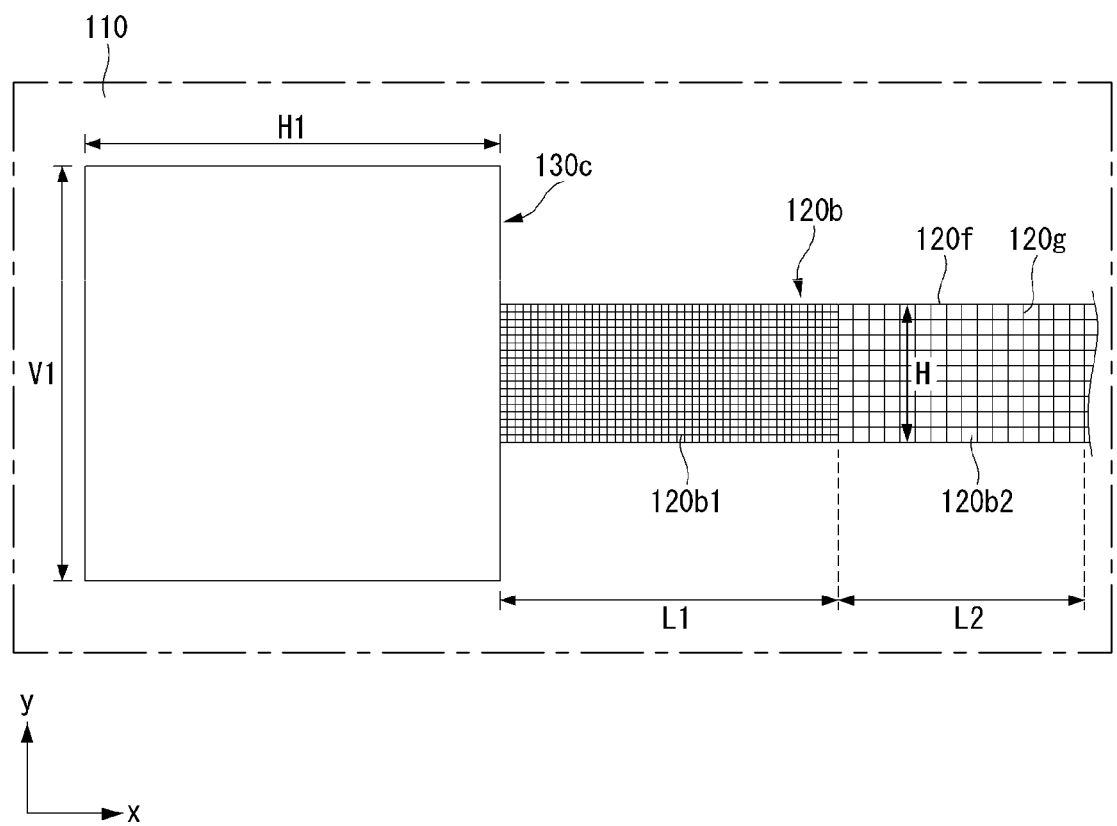

Referring to FIG. 28, an electrode layer 120*b* may include a first region 120*b*1 or a second region 120*b*2. The regions 120*b*1 and 120*b*2 may be referred to as parts 120*b*1 and 120*b*2. The first region 120*b*1 may be located between a pad 130*c* and the second region 120*b*2. The pad 130*c* may be physically or electrically connected to the first region 120*b*1. One side of the first region 120*b*1 may be physically or electrically connected to the pad 130*c*. Other side of the first region 120*b*1 may be physically or electrically connected to the second region 120*b*2. The first region 120*b*1 may have a length L1. The second region 120*b*2 may have a length L2.

A density of a mesh shape of the first region 120*b*1 may be higher than a density of a mesh shape of the second region 120*b*2. The density of the mesh shape of the second region 120*b*2 may be the same as a density of a mesh shape of the pad 130*c*. Alternatively, the number of mesh-shaped openings of the first region 120*b*1 per unit area may be larger than the number of mesh-shaped openings of the second region 120*b*2 per unit area. The number of mesh-shaped openings of the pad 130*c* per unit area may be the same as the number of mesh-shaped openings of the second area 120*b*2 per unit area. The length L2 may be greater than the length L1. The length L1 may be less than the length H1. Alternatively, the length L1 may be substantially equal to or greater than the length H1. As the length L1 becomes longer, the connection strength between the pad 130*c* and the first region 120*b*1 can be increased. In contrast to FIGS. 26 and 28, in the case of FIG. 28, the number of first lines 120*f* connected to the pad 130*c* may be larger than that of FIG. 26. Accordingly, in contrast to the case of FIG. 26, disconnection of the pad 130*c* and the electrode layer 120*b* may be reduced.

Figure 29:
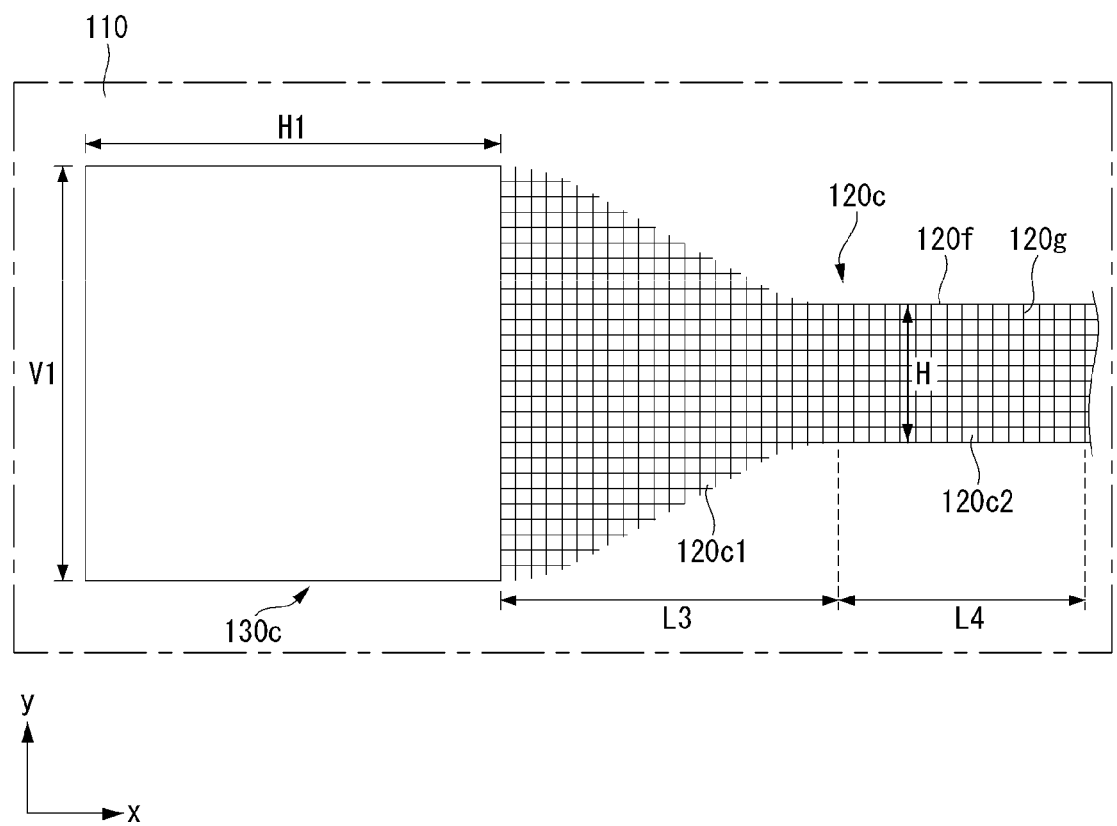

Referring to FIG. 29, an electrode layer 120*c* may include a first region 120*c*1 or a second region 120*c*2. The regions 120*c*1 and 120*c*2 may be referred to as parts 120*c*1 and 120*c*2. The first region 120*c*1 may be located between a pad 130*c* and the second region 120*c*2. The pad 130*c* may be physically or electrically connected to the first region 120*c*1. One side of the first region 120*c*1 may be physically or electrically connected to the pad 130*c*. Other side of the first region 120*c*1 may be physically or electrically connected to the second region 120*c*2. The first region 120*c*1 may have a length L3. The second region 120*c*2 may have a length L4. A vertical length of the one side of the first region 120*c*1 may be V1, and a vertical length of the other side of the first region 120*c*1 may be H. The length V1 may be greater than the length H. The vertical length of the first region 120*c*1 may be reduced from the one side of the first region 120*c*1 to the other side of the first region 120*c*1.

A mesh shape of the first region 120*c*1 and a mesh shape of the second region 120*c*2 may be the same. Alternatively, the number of mesh-shaped openings of the first region 120*c*1 per unit area and the number of the mesh-shaped openings of the second region 120*c*2 per unit area may be equal to each other. The length L3 may be greater than the length L4. The length L3 may be less than the length H1. Alternatively, the length L3 may be substantially equal to or greater than the length H1. The longer the length L3, the higher the connection strength between the pad 130*c* and the first region 120*c*1. In contrast to FIGS. 26 and 29, in the case of FIG. 29, the number of first lines 120*f* connected to the pad 130*c* may be larger than that of FIG. 26. Accordingly, in contrast to the case of FIG. 26, disconnection of the pad 130*c* and the electrode layer 120*c* may be reduced.

Figure 30:
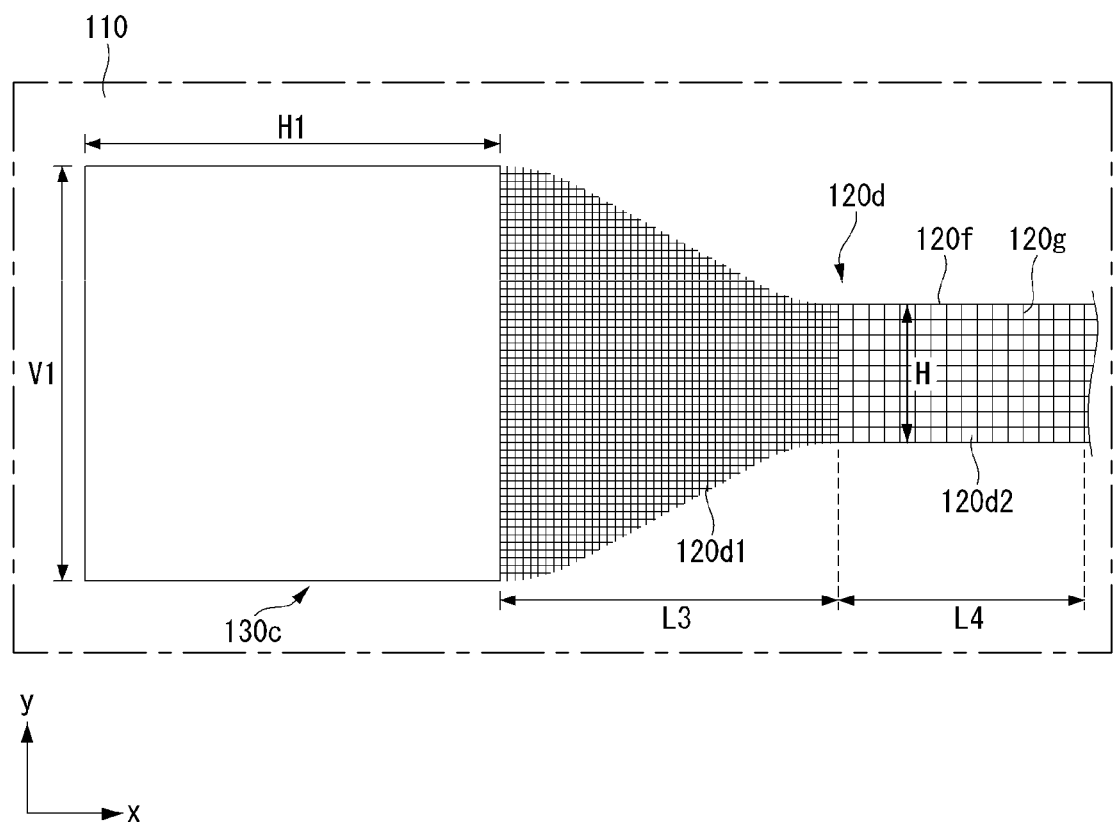

Referring to FIG. 30, an electrode layer 120*d* may include a first region 120*d*1 or a second region 120*d*2. The regions 120*d*1 and 120*d*2 may be referred to as parts 120*d*1 and 120*d*2. The first region 120*d*1 may be located between a pad 130*c* and the second region 120*d*2. The pad 130*c* may be physically or electrically connected to the first region 120*d*1. One side of the first region 120*d*1 may be physically or electrically connected to the pad 130*c*. Other side of the first region 120*d*1 may be physically or electrically connected to the second region 120*d*2. The first region 120*d*1 may have a length L3. The second region 120*d*2 may have a length L4. A vertical length of the one side of the first area 120*d*1 may be V1 and a vertical length of the other side may be H. The length V1 may be greater than the length H. The vertical length of the first region 120*d*1 may be reduced from the one side of the first region 120*d*1 to the other side of the first region 120*d*1.

A density of a mesh shape of the first region 120*d*1 may be higher than a density of a mesh shape of the second region 120*d*2. Alternatively, the number of mesh-shaped openings of the first region 120*d*1 per unit area may be larger than the number of mesh-shaped openings of the second region 120*d*2 per unit area. The length L4 may be greater than the length L3. The length L3 may be less than the length H1. Alternatively, the length L3 may be substantially equal to or greater than the length H1. The longer the length L3, the higher the connection strength between the pad 130*c* and the first region 120*d*1. In contrast to FIGS. 26 and 30, in the case of FIG. 30, the number of first lines 120*f* connected to the pad 130*c* may be larger than that of FIG. 26. Accordingly, in contrast to the case of FIG. 26, disconnection of the pad 130*c* and the electrode layer 120*d* may be reduced.

Figure 31:
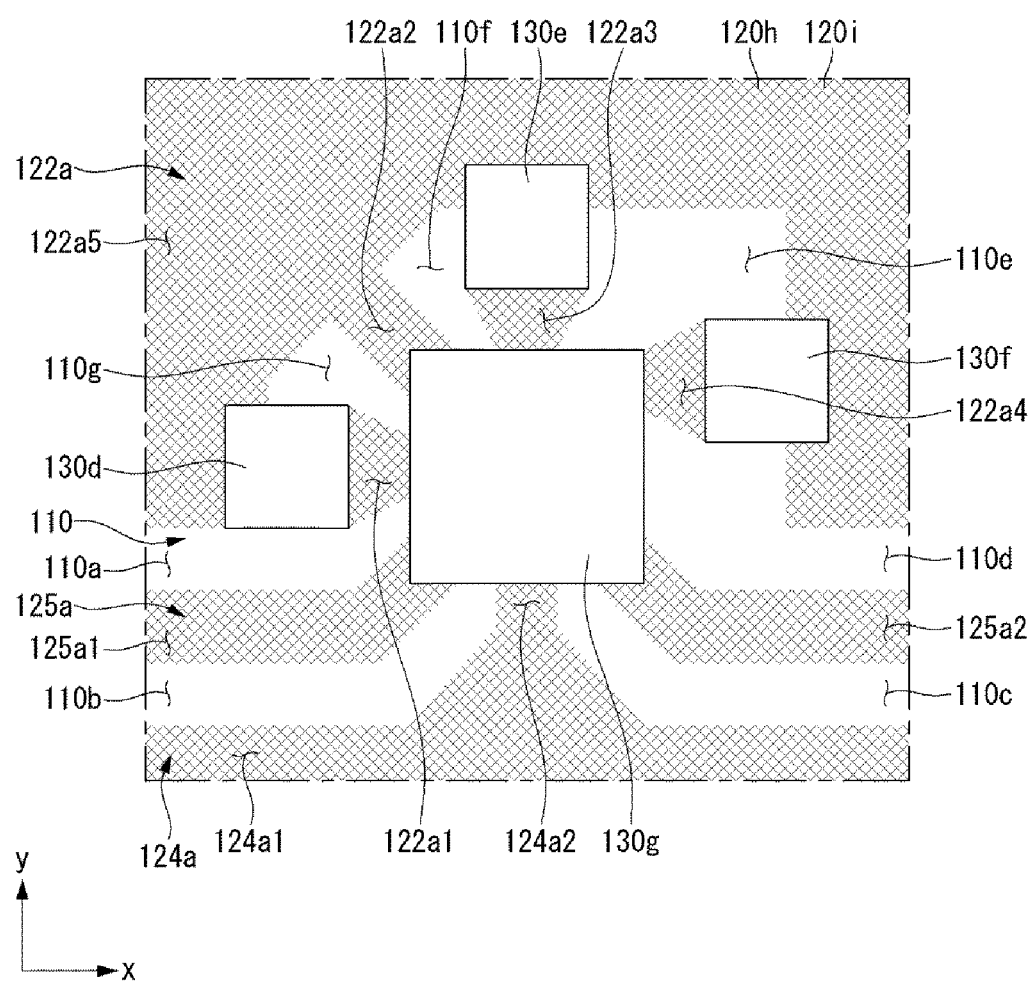

Referring to FIG. 31, a pad 130*g* may be surrounded by pads 130*d*, 130*e*, and 130*f*. A first part 122*a*5 may be physically or electrically connected to the pads 130*d*, 130*e*, and 130*f*. A second part 122*a*2 may be physically or electrically connected to the pad 130*g*. A third part 122*a*1 may physically or electrically connect the pads 130*d* and 130*g*. A fourth part 122*a*3 may physically or electrically connect the pads 130*e* and 130*g*. A fifth part 122*a*4 may physically or electrically connect the pads 130*f* and 130*g*. LED chips 140*a*, 140*b*, and 140*c* may be physically or electrically connected to the pads 130*d*, 130*e*, and 130*f*. An IC chip 140*d* may be physically or electrically connected to the pad 130*g*. A positive electrode 122*a* may include at least one of the first part 122*a*5 to the fifth part 122*a*4. The positive electrode 122*a* may include a mesh shape. A region 110*g* where the mesh shape is not formed may be located between the second part 122*a*2 and the third part 122*a*1. The region 110*g* where the mesh shape is not formed may be located between the second part 122*a*2 and the pas 130*d*. A region 110*f* where the mesh shape is not formed may be located between the second part 122*a*2 and the fourth part 122*a*3. The region 110*f* where the mesh shape is not formed may be located between the second part 122*a*2 and the pad 130*e*. A region 110*e* where the mesh shape is not formed may be located between the fourth part 122*a*3 and the fifth part 122*a*4. The region 110*e* where the mesh shape is not formed may be located between the pads 130*e* and 130*f*.

One side of a first part 125*a*1 may be physically or electrically connected to the pad 130*g*. One side of a second part 125*a*2 may be physically or electrically connected to the pad 130*g*. A control electrode 125*a* may include the first part 125*a*1 or the second part 125*a*2.

A first part 124*a*1 may face the control electrode 125*a*. A second part 124*a*2 may extend from the first part 124*a*1 and may be physically or electrically connected to the pad 130*g*. A negative electrode 124*a* may include the first part 124*a*1 or the second part 124*a*2. A region 110*a* where the mesh shape is not formed may be located between the parts 122*a*1 and 125*a*1. The region 110*a* where the mesh shape is not formed may be located between the parts 122a5 and 125a1. The region 110a where the mesh shape is not formed may be located between the parts 125a1 and the pad 130d. A region 110d where the mesh shape is not formed may be located between the parts 122a4 and 125a2. The region 110d where the mesh shape is not formed may be located between the parts 122a5 and 125a2. The region 110d where the mesh shape is not formed may be located between the part 125a2 and the pad 130f. A region 110b where the mesh shape is not formed may be located between the parts 125a1 and 124a2. The region 110b where the mesh shape is not formed may be located between the parts 125a1 and 124a1. A region 110c where the mesh shape is not formed may be located between the parts 125a2 and 124a2. The region 110c where the mesh shape is not formed may be located between the parts 125a2 and 124a1.

Figure 32:
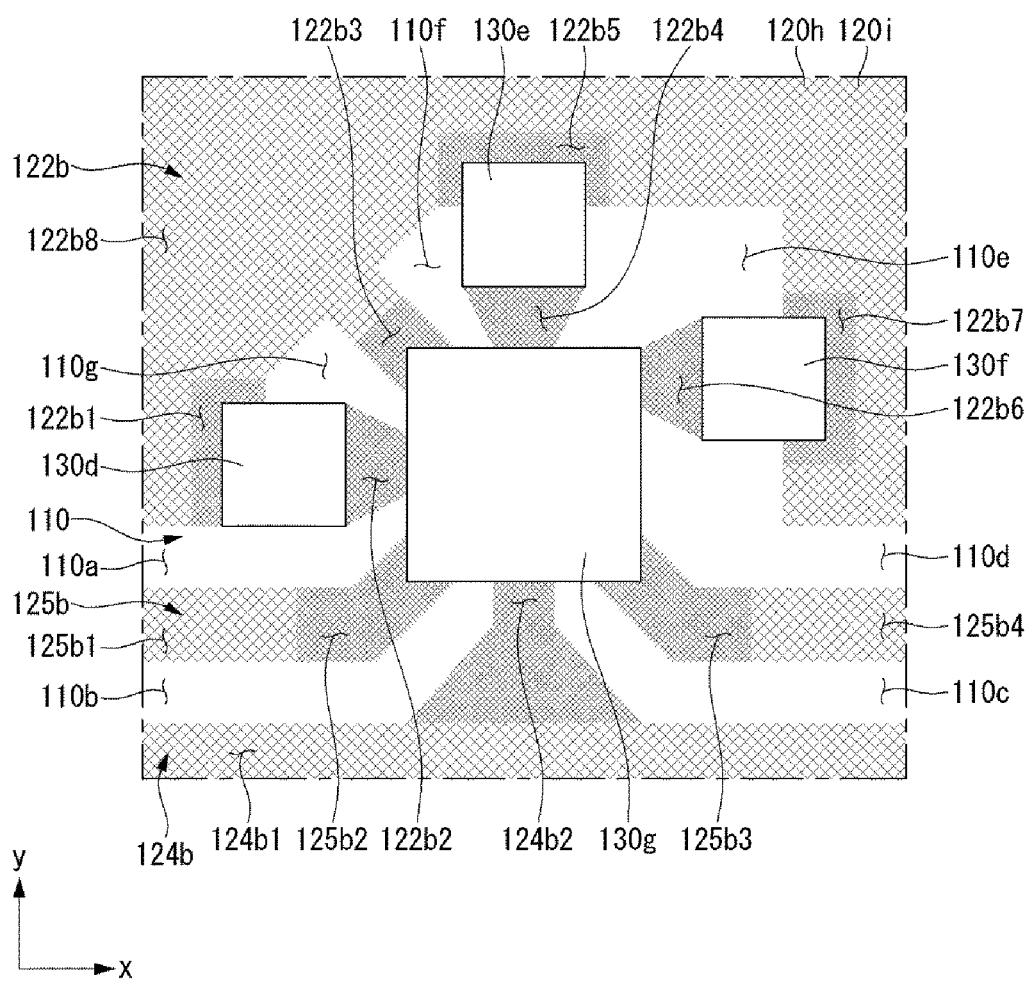

Referring to FIG. 32, a pad 130g may be surrounded by pads 130d, 130e, and 130f. A first part 122b8 may be adjacent to the pads 130d, 130e, and 130f and may surround the pads 130d, 130e, and 130f. A second part 122b2 may physically or electrically connect the pads 130d and 130g. A third part 122b1 may physically or electrically connect the first part 122b8 and the pad 130d. A fourth part 122b3 may physically or electrically connect the pad 130g and the first part 122b8. A fifth part 122b4 may physically or electrically connect the pads 130g and 130e. A sixth part 122b5 may physically or electrically connect the pad 130e and the first part 122b8. A seventh part 122b6 may physically or electrically connect the pads 130g and 130f. An eighth part 122b7 may physically or electrically connect the pad 130f and the first part 122b8.

A positive electrode 122b may include at least one of the first part 122b8 to the eighth part 122b7. The positive electrode 122b may include a mesh shape. A region 110g where the mesh shape is not formed may be located between the second part 122b2 and the fourth part 122b3. The region 110g where the mesh shape is not formed may be located between the first part 122b8 and the pad 130d. A region 110f where the mesh shape is not formed may be located between the fourth part 122b3 and the fifth part 122b4. The region 110f where the mesh shape is not formed may be located between the fourth part 122b3 and the pad 130e. A region 110e where the mesh shape is not formed may be located between the fifth part 122b4 and the seventh part 122b6. The region 110e where the mesh shape is not formed may be located between the pads 130e and 130f.

One side of a first part 125b1 may be physically or electrically connected to a second part 125b2. The second part 125b2 may be physically or electrically connected to the first part 125b1 and the pad 130g. One side of a fourth part 125b4 may be physically or electrically connected to a third part 125b3. The third part 125b3 may be physically or electrically connected to the fourth part 125b4 and the pad 130g. A control electrode 125b may include at least one of the first part 125b1 to the fourth part 125b4.

A first part 124b1 may face the control electrode 125b. A second part 124b2 may extend from the first part 124b1 and may be physically or electrically connected to the pad 130g. A negative electrode 124b may include the first part 124b1 or the second part 124b2. A region 110a where the mesh shape is not formed may be located between the parts 122b1 and 125b1. The region 110a where the mesh shape is not formed may be located between the parts 122b2 and 125b2. The region 110a where the mesh shape is not formed may be located between the part 125b1 and the pad 130d. A region 110d where the mesh shape is not formed may be located between the parts 122b8 and 125b4. The region 110d where the mesh shape is not formed may be located between the parts 122b6 and 125b3. The region 110d where the mesh shape is not formed may be located between the part 125b3 and the pad 130f. A region 110b where the mesh shape is not formed may be located between the parts 125b1 and 124b1. The region 110b where the mesh shape is not formed may be located between the parts 125b2 and 124b2. A region 110c where the mesh shape is not formed may be located between the parts 125b4 and 124b1. The region 110c where the mesh shape is not formed may be located between the parts 125b3 and 124b2.

Densities of the mesh shapes of the parts 122b8, 125b1, 125b4, and 124b1 may be the same. Alternatively, the number of openings of the mesh shape of the parts 122b8, 125b1, 125b4, and 124b1 per unit area may be equal to each other. Densities of the mesh shapes of the parts 122b1, 122b2, 122b3, 122b4, 122b5, 122b6, 122b7, 125b2, 125b3, and 124b2 may be the same. Alternatively, the number of openings of the mesh shape of the parts 122b1, 122b2, 122b3, 122b4, 122b5, 122b6, 122b7, 125b2, 125b3, 124b2 per unit area may be equal to each other. The densities of the mesh shapes of the parts 122b1, 122b2, 122b3, 122b4, 122b5, 122b6, 122b7, 125b2, 125b3 and 124b2 may be higher than the densities of the mesh shapes of the parts 122b8, 125b1, 125b4 and 124b1. Alternatively, the number of openings of the mesh shape of the parts 122b1, 122b2, 122b3, 122b4, 122b5, 122b6, 122b7, 125b2, 125b3, and 124b2 per unit area may be greater than the number of openings of the mesh shape of the parts 122b8, 125b1, 125b4, and 124b1 per unit area.

In contrast to FIGS. 31 and 32, in the case of FIG. 32, the number of a first line 120h or a second line 120i connected to the pads 130d, 130e, 130f, and 130g may be larger than that in the case of FIG. 31. Therefore, in contrast to the case of FIG. 31, disconnection of the pads 130d, 130e, 130f, and 130g and the electrode layers 122b, 125b, and 124b may be reduced.

Figure 33:
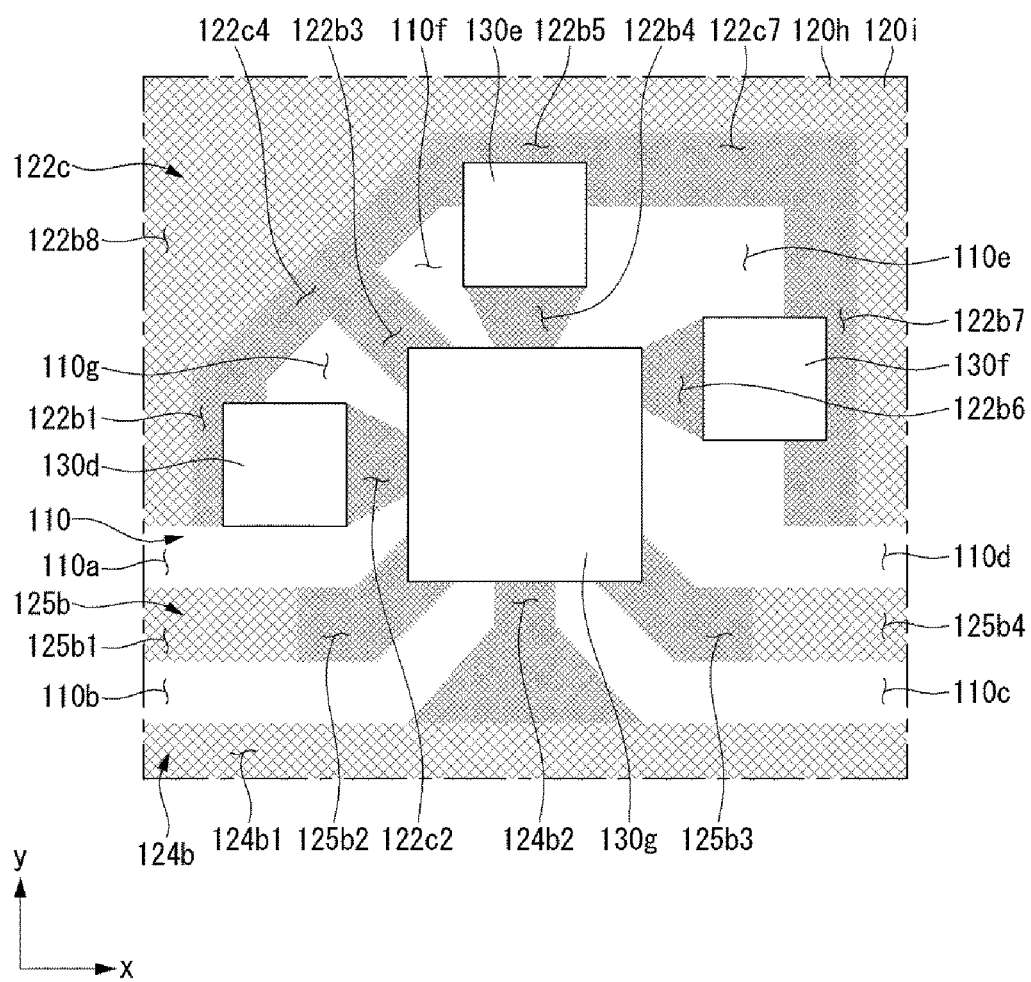

Referring to FIG. 33, a ninth part 122c4 may physically or electrically connect a third part 122b1, a fourth part 122b3, and a sixth part 122b5. A tenth part 122c7 may physically or electrically connect the sixth part 122b5 and an eighth part 122b7. A positive electrode 122c may include at least one of a first part 122b8 to the tenth part 122c7.

Densities of mesh shapes of the parts 122c4 and 122c7 may be equal to each other. Alternatively, the number of openings of the mesh shape of the parts 122c4 and 122c7 per unit area may be equal to each other. The densities of the mesh shapes of the parts 122c4 and 122c7 may be higher than densities of the mesh shapes of parts 122b8, 125b1, 125b4 and 124b1. Alternatively, the number of openings of the mesh shape of the parts 122c4, 122c7 per unit area may be larger than the number of openings of the mesh shape of the parts 122b8, 125b1, 125b4, and 124b1 per unit area.

In contrast to FIG. 31 and FIG. 33, in the case of FIG. 33, the number of a first line 120h or a second line 120i connected to the pads 130d, 130e, 130f, and 130g may be larger than that in the case of FIG. 31. Therefore, in contrast to the case of FIG. 31, disconnection of the pads 130d, 130e, 130f, and 130g and electrode layers 122c, 125b, and 124b may be reduced.

Figure 34:
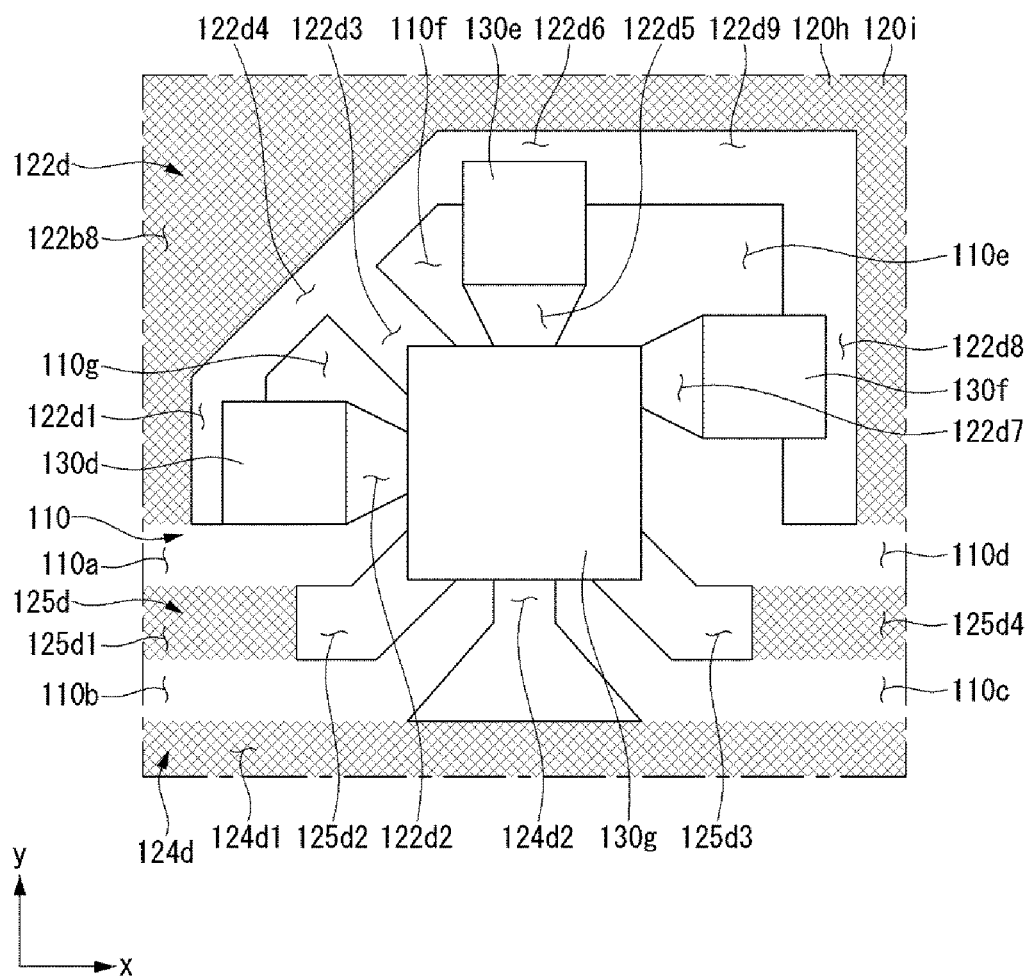

Referring to FIG. 34, a second part 122d2 may physically or electrically connect pads 130d and 130g. A third part 122d1 may physically or electrically connect a first part 122b8 and the pad 130d. A fourth part 122d3 may be physically or electrically connected to the pad 130g. A ninth part 122d4 may be located between the first part 122b8 and the fourth part 122d3 and may physically or electrically connect the first part 122*b*8 to the fourth part 122*d*3. A fifth part 122*d*5 may be located between the pad 130*g* and a pad 130*e* and may physically or electrically connect the pad 130*g* to the pad 130*e*. A sixth part 122*d*6 may physically or electrically connect the first part 122*b*8 and the pad 130*e*. A seventh part 122*d*7 may be located between the pad 130*g* and a pad 130*f* and may physically or electrically connect the pad 130*g* to the pas 130*f*. An eighth part 122*d*8 may be located between the first part 122*b*8 and the pad 130*f* and may physically or electrically connect the first part 122*b*8 to the pad 130*f*. A tenth part 122*d*9 may physically or electrically connect the sixth part 122*d*6 and the eighth part 122*d*8. A positive electrode 122*d* may include at least one of the first to tenth parts. The second part 122*d*2 to the tenth part 122*d*9 may be a metal film or a metal thin film formed on a base 110 instead of a mesh shape. For example, the second part 122*d*2 to the tenth part 122*d*9 may be a film containing a copper material.

The positive electrode 122*d* may include a mesh shape. A region 110*g* where the mesh shape is not formed may be located between the second part 122*d*2 and the fourth part 122*d*3. The region 110*g* where the mesh shape is not formed may be located between the ninth part 122*d*4 and the pad 130*d*. A region 110*f* where the mesh shape is not formed may be located between the fourth part 122*d*3 and the fifth part 122*d*5. The region 110*f* where the mesh shape is not formed may be located between the fourth part 122*d*3 and the pad 130*e*. A region area 110*e* where the mesh shape is not formed may be located between the fifth part 122*d*5 and the seventh part 122*d*7. The region 110*e* where the mesh shape is not formed may be located between the pads 130*e* and 130*f*.

One side of a first part 125*d*1 may be physically or electrically connected to a second part 125*d*2. The second part 125*d*2 may be physically or electrically connected to the first part 125*d*1 and the pad 130*g*. One side of a fourth part 125*d*4 may be physically or electrically connected to a third part 125*d*3. The third part 125*d*3 may be physically or electrically connected to the fourth part 125*d*4 and the pad 130*g*. A control electrode 125*d* may include at least one of the first part 125*d*1 to the fourth part 125*d*4.

A first part 124*d*1 may face the control electrode 125*d*. A second part 124*d*2 may extend from the first part 124*d*1 and may be physically or electrically connected to the pad 130*g*. A negative electrode 124*d* may include the first part 124*d*1 or the second part 124*d*2. A region 110*a* where the mesh shape is not formed may be located between the parts 122*d*2 and 125*d*2. The region 110*a* where the mesh shape is not formed may be located between the parts 122*d*1 and 125*d*1. The region 110*a* where the mesh shape is not formed may be located between the part 125*d*2 and the pad 130*d*. A region 110*d* where the mesh shape is not formed may be located between the parts 122*d*7 and 125*d*3. The region 110*d* where the mesh shape is not formed may be located between the parts 122*d*8 and 125*d*4. The region 110*d* where the mesh shape is not formed may be located between the part 125*d*3 and the pad 130*f*. A region 110*b* where the mesh shape is not formed may be located between the parts 125*d*1 and 124*d*1. The region 110*b* where the mesh shape is not formed may be located between the parts 125*d*2 and 124*d*2. A region 110*c* where the mesh shape is not formed may be located between the parts 125*d*4 and 124*d*1. The region area 110*c* where the mesh shape is not formed may be located between the parts 125*d*3 and 124*d*2.

The parts 125*d*2, 124*d*2, and 125*d*3 may be a metal film or a metal thin film formed on the base 110 instead of a mesh shape. For example, the parts 125*d*2, 124*d*2, and 125*d*3 may be a film containing a copper material.

In contrast to FIGS. 31 and 34, the number of a first line 120*h* or a second line 120*i* connected to the parts 122*d*1, 122*d*2, 122*d*3, 122*d*4, 122*d*5, 122*d*6, 122*d*7, 122*d*8, 122*d*9, 125*d*2, 125*d*3, and 124*d*2 may be greater than the number of the first line 120*h* or the second line 120*i* connected to the pads 130*d*, 130*e*, 130*f*, and 130*g*. Therefore, in contrast to the case of FIG. 31, disconnection of the electrode layers 122*d*, 125*d*, and 124*d* may be reduced.

Figure 35:
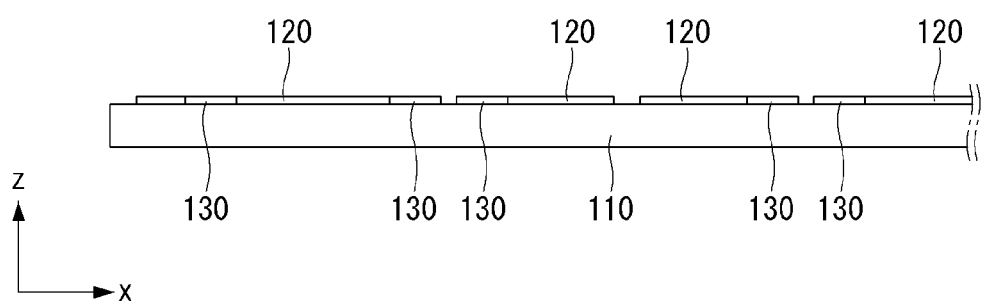

As shown in FIG. 35, a pad 130 may be formed as a part of an electrode layer 120. The pad 130 may be formed in a plurality.

Figure 36:
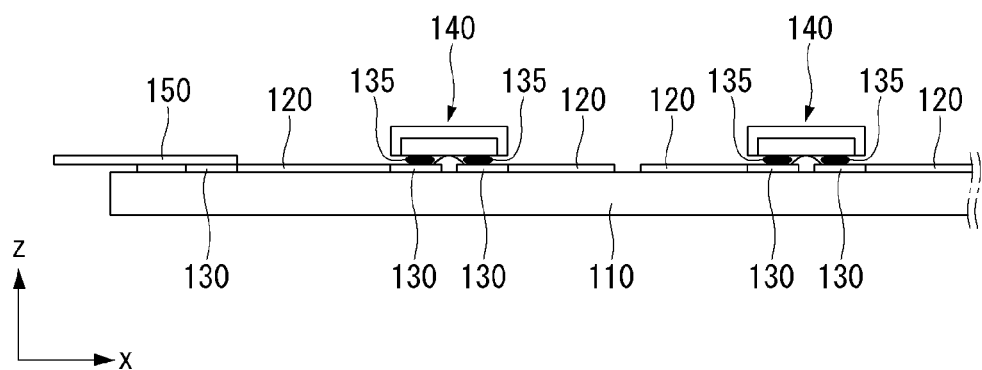

Referring to FIG. 36, a solder 135 may be formed on the pad 130. The solder 135 may attach a light source assembly 140 or an FPCB 150 to the pad 130. The solder 135 may include an epoxy. The epoxy can improve strength of the solder 135. The solder 135 may be formed by a low temperature reflow process. For example, the low temperature reflow process may proceed at 160 degrees. Since a base 110, the electrode layer 120, and the pad 130 have high melting points, there is no change in the state at 160 degrees. The FPCB 150 may physically or electrically connect the electrode layer 120 to an external circuit.

Figure 37:
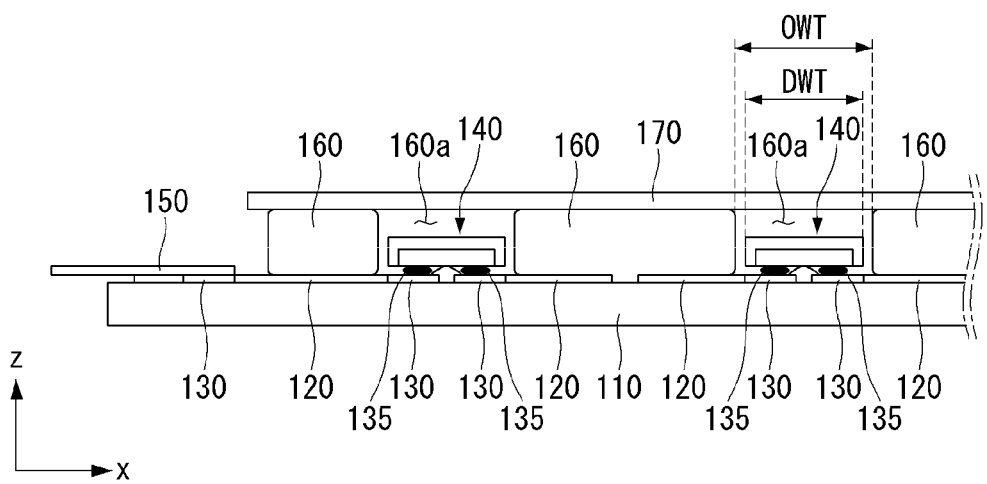

Referring to FIG. 37, an adhesive layer 160 may be formed on the base 110. The electrode layer 120 may be located between the base 110 and the adhesive layer 160. The adhesive layer 160 may include optical clear adhesive (OCA). For example, the adhesive layer 160 may be silicon, acrylic, or a combination thereof. The adhesive layer 160 may include a hole 160*a*. The light source assembly 140 may be located in the hole 160*a*. A height of the adhesive layer 160 may be higher than a height of the light source assembly 140. For example, the height of the adhesive layer 160 may be 500 μm or more to 800 μm or less. A width OWT of the hole 160*a* may be larger than a width DWT of the light source assembly 140. A protective layer 170 may be located on the adhesive layer 160. The protective layer 170 can prevent the adhesive layer 160 from being exposed to the outside and the protective layer 170 can preserve an adhesive force of the adhesive layer 160. The protective layer 170 may be separated from the adhesive layer 160 as needed.

Figure 38:
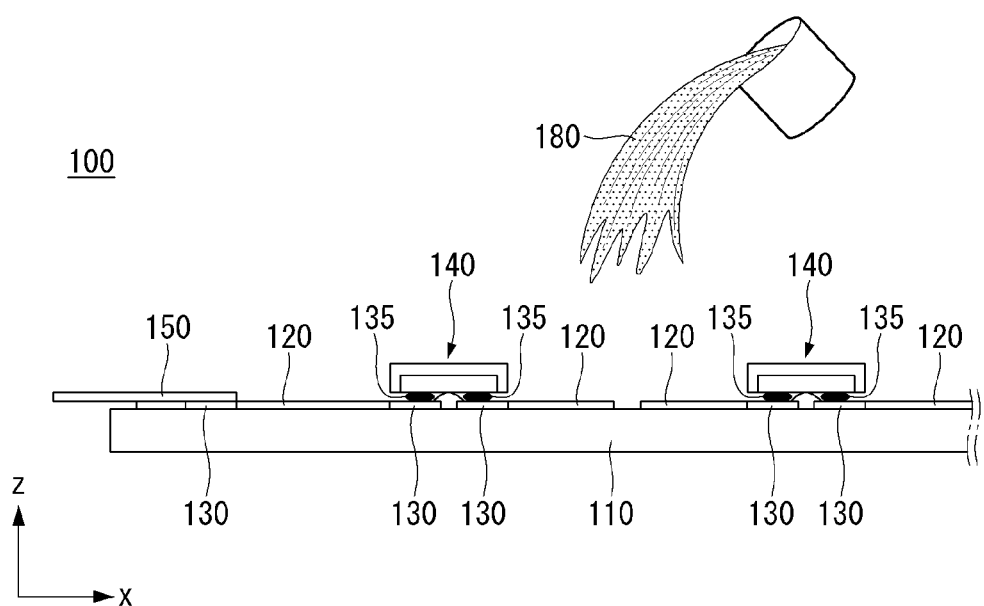
Figure 39:
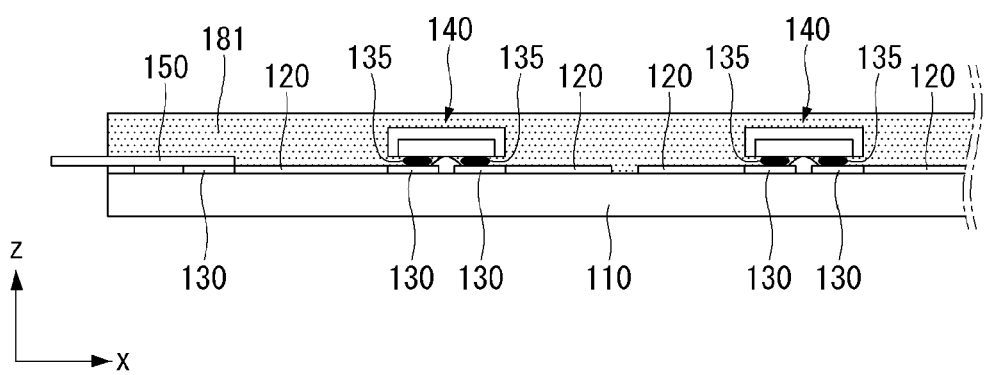

Referring to FIGS. 38 and 39, resin 180 may be applied to the base 110, the electrode layer 120, the FPCB 150, and the light source assembly 140. A primer process may be performed on the electrode layer 120 for adhesion between the resin 180 and the electrode layer 120. After the resin 180 is applied to the base 110, the electrode layer 120, the FPCB 150, and the light source assembly 140, a thermosetting or photo-curing process may be performed. The resin 180 may be formed into a resin layer 181 through the thermosetting or photo-curing process.

The resin layer 181 may cover the FPCB 150 or the light source assembly 140. As a result, the FPCB 150 or the light source assembly 140 may not be exposed to the outside. The FPCB 150 or the light source assembly 140 can be protected from external impact through the resin layer 181.

The resin 180 may have high adhesion properties. For example, the resin 180 may be optical clear resin (OCR). The resin 180 can function as an adhesive due to its high adhesion property. For example, the resin layer 181 may attach the display device 100 to the attached surface 250.

Figure 40:
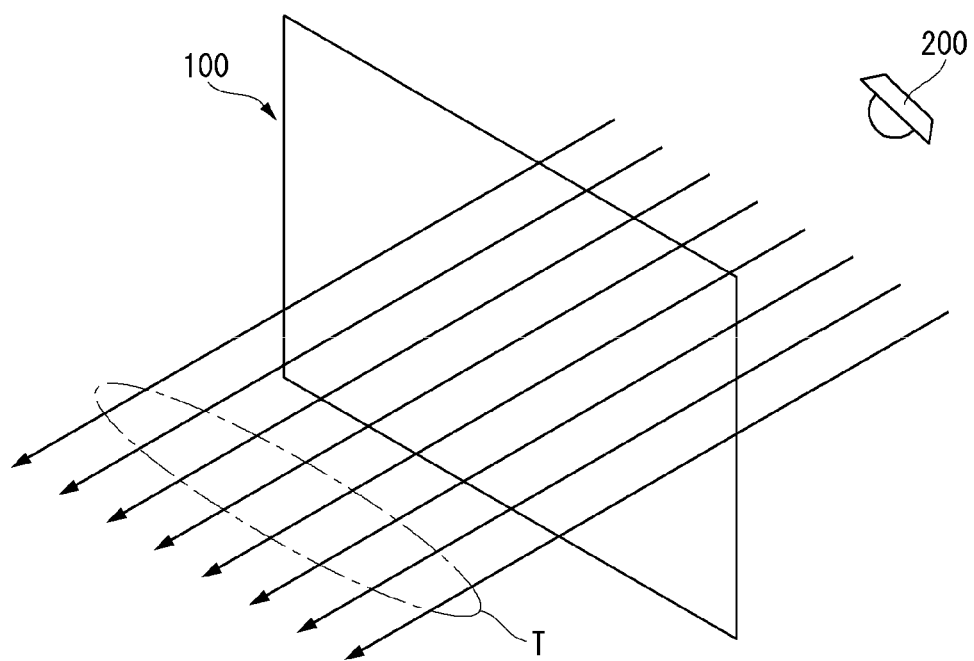

Referring to FIG. 40, the base 110, the adhesive layer 160, and the resin layer 181 may have light transmittance, and the electrode layer 120 may have a plurality of openings. Accordingly, light T emitted from a light source 200 can pass through the display device 100. The display device 100 can transmit light incident on the attached surface 250 even when attached to the attached surface 250 having light transmittance.

Figure 41:
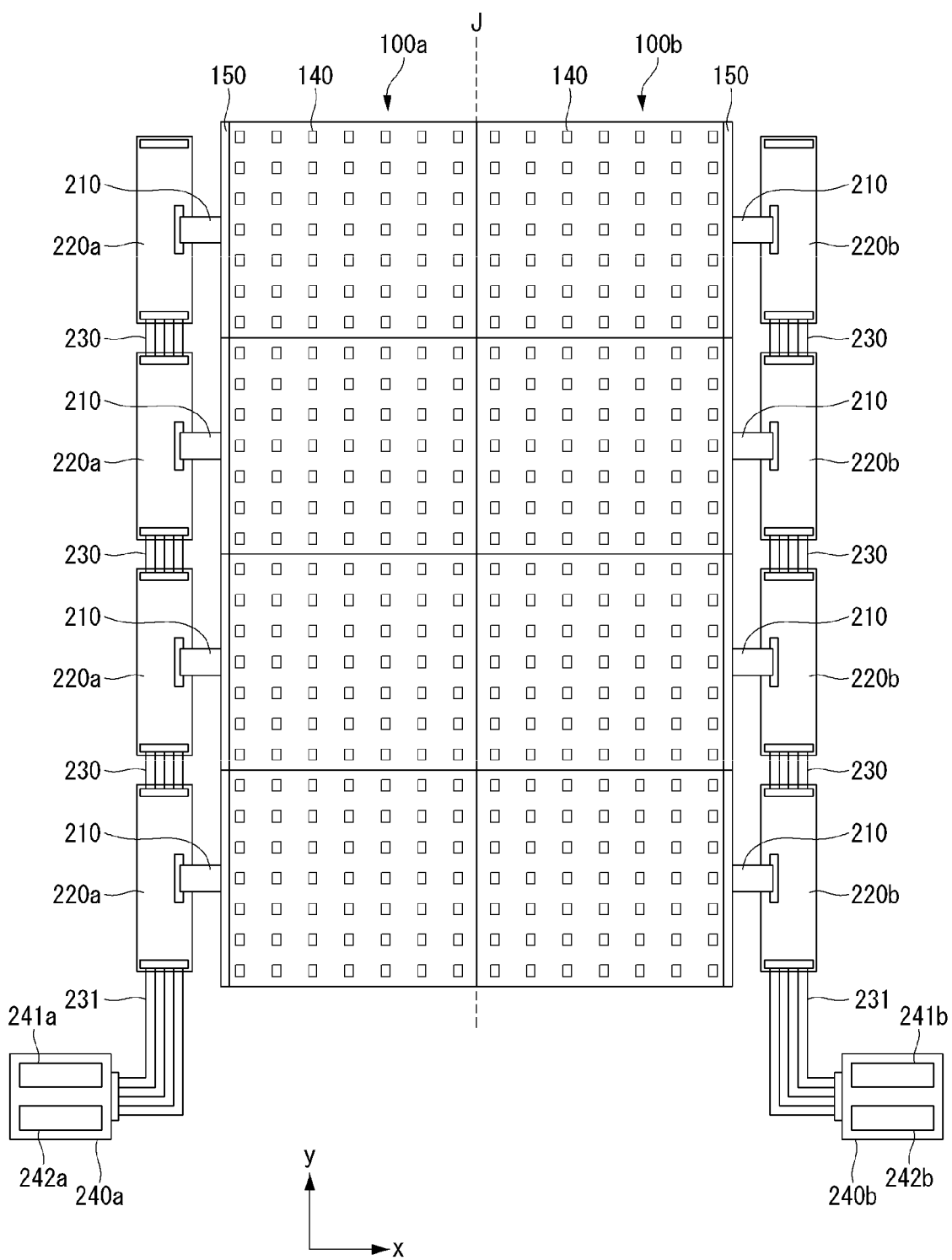

Referring to FIG. 41, a plurality of display devices 100*a* and 100*b* may be formed. The plurality of display devices 100*a* and 100*b* may be horizontally symmetrical with respect to an axis of symmetry J.

The plurality of display devices 100*a* located on the left side of the axis of symmetry J may be disposed along the y-axis direction. Each of the plurality of display devices 100*a* may be connected to a PCB 220*a*. The PCB 220*a* may be formed in a plurality and may be located to correspond to each of the display devices 100*a*. A connector 150 of each display device 100*a* may be connected to the PCB 220*a*. A first connection part 210 may electrically connect the connector 150 to the PCB 220*a*. A second connection part 230 may electrically connect neighboring PCB 220*a*. A lowermost PCB 220*a* may be connected to a main board 240*a*. A third connection part 231 can electrically connect the lowermost PCB 220*a* to the main board 240*a*. The main board 240*a* may include a power board 241*a* and a control board 242*a*. The power board 241*a* can supply power, and the control board 242*a* can transmit a control signal.

The plurality of display devices 100*b* located on the right side of the axis of symmetry J may be disposed along the y-axis direction. Each of the plurality of display devices 100*b* may be connected to a PCB 220*b*. The PCB 220*b* may be formed in a plurality and may be located to correspond to each of the display devices 100*b*. A connector 150 of each display device 100*b* may be connected to the PCB 220*b*. A first connection part 210 may electrically connect the connector 150 to the PCB 220*b*. A second connection part 230 can electrically connect neighboring PCB 220*b*. A lowermost PCB 220*b* may be connected to a main board 240*b*. A third connection part 231 can electrically connect the lowermost PCB 220*b* to the main board 240*b*. The main board 240*b* may include a power board 241*b* and a control board 242*b*. The power board 241*b* can supply power, and the control board 242*b* can transmit a control signal.

Figure 42:
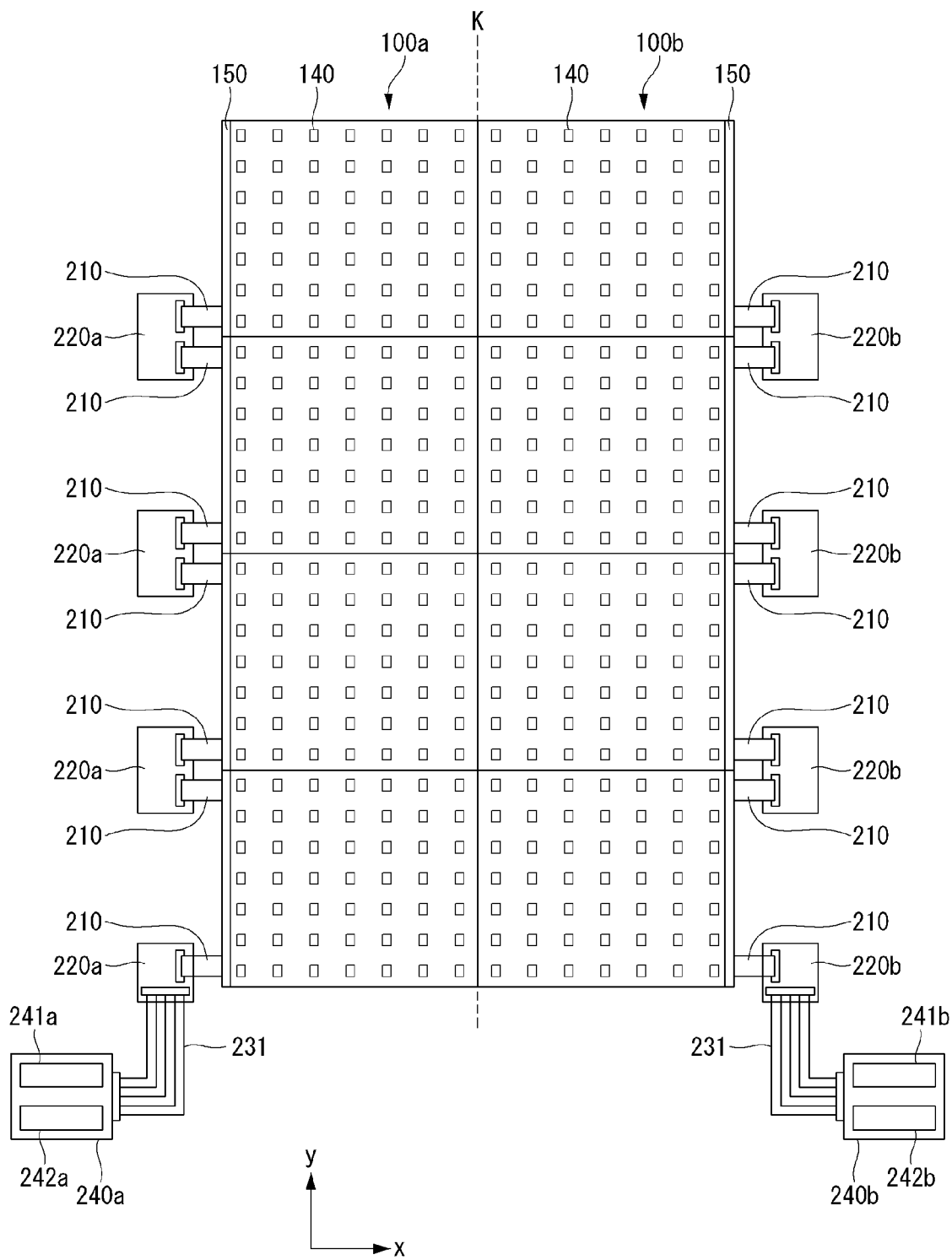

Referring to FIG. 42, a plurality of display devices 100*a* and 100*b* may be formed. The plurality of display devices 100*a* and 100*b* may be horizontally symmetrical with respect to an axis of symmetry K.

The plurality of display devices 100*a* located on the left side of the axis of symmetry K may be disposed along the y-axis direction. Neighboring display devices 100*a* may be connected to one PCB 220*a*. A connector 150 of each display device 100*a* may be connected to the PCB 220*a*. A first connection part 210 may electrically connect the connector 150 to the PCB 220*a*. A lowermost PCB 220*a* may be connected to a main board 240*a*. A third connection part 231 may electrically connect the lowermost PCB 220*a* to the main board 240*a*. The main board 240*a* may include a power board 241*a* and a control board 242*a*. The power board 241*a* can supply power, and the control board 242*a* can transmit a control signal.

The plurality of display devices 100*b* located on the right side of the axis of symmetry K may be disposed along the y-axis direction. Neighboring display devices 100*b* may be connected to one PCB 220*b*. A connector 150 of each display device 100*b* may be connected to the PCB 220*b*. A first connection part 210 may electrically connect the connector 150 to the PCB 220*b*. A lowermost PCB 220*b* may be connected to a main board 240*b*. A third connection part 231 may electrically connect the lowermost PCB 220*b* to the main board 240*b*. The main board 240*b* may include a power board 241*b* and a control board 242*b*. The power board 241*b* can supply power, and the control board 242*b* can transmit a control signal.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
a light-transmitting substrate;
a pad disposed on the light-transmitting substrate; and
an electrode layer comprising a mesh configuration formed on the light-transmitting substrate and electrically connected to the pad,
wherein the electrode layer comprises:
a first region spaced apart from the pad; and
a second region connecting the pad to the first region,
wherein a density of the mesh configuration of the second region is higher than a density of the mesh configuration of the first region,
wherein a length of a side of the pad connected to the second region is substantially equal to a length of a first side of the second region connected to the pad, and
wherein a second side of the second region is connected to the first region and the first side of the second region is longer than the second side of the second region.

2. The display device of claim 1, wherein a length of the second region is less than a length of the pad.

3. The display device of claim 1, wherein the mesh configuration comprises:
a plurality of first lines spaced apart and extending in a longitudinal direction of the electrode layer; and,
a plurality of second lines spaced apart and extending in a direction orthogonal to the longitudinal direction of the electrode layer to intersect the plurality of first lines.

4. The display device of claim 1, wherein the pad comprises a mesh configuration and is electrically connected to the electrode layer.

5. The display device of claim 1, wherein the pad comprises a metal film.

6. The display device of claim 1, wherein the electrode layer comprises copper oxide.

7. A display device, comprising:
- a light-transmitting substrate;
- a first pad disposed on the light-transmitting substrate;
- an electrode layer comprising a mesh configuration formed on the light-transmitting substrate and electrically connected to the first pad, wherein the electrode layer comprises a first region spaced apart from the first pad; and a second region connecting the first pad to the first region, wherein a density of the mesh configuration of the second region is higher than a density of the mesh configuration of the first region,
- a second pad disposed on the light-transmitting substrate, wherein the second pad is spaced apart from the first pad and spaced apart from the electrode layer; and
- a second electrode layer comprising a mesh configuration and electrically connecting the first pad to the second pad,
- wherein a density of the mesh configuration of the second electrode layer is higher than the density of the mesh configuration of the first region.

8. The display device of claim 7, wherein the density of the mesh configuration of the second electrode layer is substantially equal to the density of the mesh configuration of the second region.

9. The display device of claim 7, wherein the electrode layer further comprises a third region electrically connected to the second pad, and
- wherein a density of the mesh configuration of the third region is higher than the density of the mesh configuration of the first region.

10. The display device of claim 9, wherein the density of the mesh configuration of the third region is substantially equal to the density of the mesh configuration of the second region.

11. The display device of claim 1, further comprising:
- a second pad disposed on the light-transmitting substrate;
- a second electrode layer electrically connecting the pad to the second pad;
- a third pad disposed on the light-transmitting substrate, wherein the third pad is spaced apart from the pad and spaced apart from the electrode layer; and
- a third electrode layer electrically connecting the pad to the third pad,
- wherein the third electrode layer comprises a metal film.

* * * * *